(12) United States Patent
Han et al.

(10) Patent No.: US 11,456,318 B2
(45) Date of Patent: Sep. 27, 2022

(54) NONVOLATILE MEMORY DEVICE HAVING A FERROELECTRIC LAYER

(71) Applicant: SK hynix Inc., Icheon-si (KR)

(72) Inventors: Jae Hyun Han, Icheon-si (KR); Jae Gil Lee, Seoul (KR); Hyangkeun Yoo, Seongnam-si (KR); Se Ho Lee, Yongin-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/891,544

(22) Filed: Jun. 3, 2020

(65) Prior Publication Data
US 2021/0175253 A1    Jun. 10, 2021

(30) Foreign Application Priority Data
Dec. 9, 2019    (KR) .................. 10-2019-0163139

(51) Int. Cl.
| | |
|---|---|
| *H01L 27/11597* | (2017.01) |
| *H01L 27/11587* | (2017.01) |
| *H01L 29/786* | (2006.01) |
| *H01L 29/78* | (2006.01) |
| *H01L 29/788* | (2006.01) |

(52) U.S. Cl.
CPC .. *H01L 27/11597* (2013.01); *H01L 27/11587* (2013.01); *H01L 29/7827* (2013.01); *H01L 29/7889* (2013.01); *H01L 29/78391* (2014.09); *H01L 29/78642* (2013.01); *H01L 29/78696* (2013.01)

(58) Field of Classification Search
CPC .......... H01L 27/1159; H01L 27/11587; H01L 27/11597; H01L 29/7827; H01L 29/78391; H01L 29/78642; H01L 29/78696; H01L 29/7889
See application file for complete search history.

(56) References Cited

U.S. PATENT DOCUMENTS

| | | | |
|---|---|---|---|
| 9,818,848 B2 | 11/2017 | Sun et al. | |
| 10,211,223 B2 * | 2/2019 | Van Houdt | ....... H01L 29/40111 |
| 10,825,834 B1 * | 11/2020 | Chen | .................. H01L 27/11587 |
| 2005/0072988 A1 * | 4/2005 | Augusto | ................ H01L 29/165 |
| | | | 257/192 |

(Continued)

FOREIGN PATENT DOCUMENTS

KR        101649091 B1    8/2016

*Primary Examiner* — Matthew E Warren

(57) ABSTRACT

A nonvolatile memory device according to an embodiment includes a substrate having an upper surface, and a gate structure disposed over the substrate. The gate structure includes at least one gate electrode layer pattern and at least one gate insulation layer pattern, which are alternately stacked along a first direction perpendicular to the upper surface. The gate structure extends in a second direction perpendicular to the first direction. The nonvolatile memory device includes a ferroelectric layer disposed on at least a portion of one sidewall surface of the gate structure. The one sidewall surface of the gate structure forms a plane substantially parallel to the first and second directions. The nonvolatile memory device includes a channel layer disposed on the ferroelectric layer, and a source electrode structure and a drain electrode structure disposed to contact the channel layer and spaced apart from each other in the second direction.

12 Claims, 30 Drawing Sheets

(56) References Cited

U.S. PATENT DOCUMENTS

| | | | |
|---|---|---|---|
| 2014/0103414 A1* | 4/2014 | Koldiaev | H01L 27/1203 257/296 |
| 2017/0358599 A1* | 12/2017 | Ramaswamy | G11C 11/223 |
| 2019/0123061 A1* | 4/2019 | Liu | G11C 11/2273 |

* cited by examiner

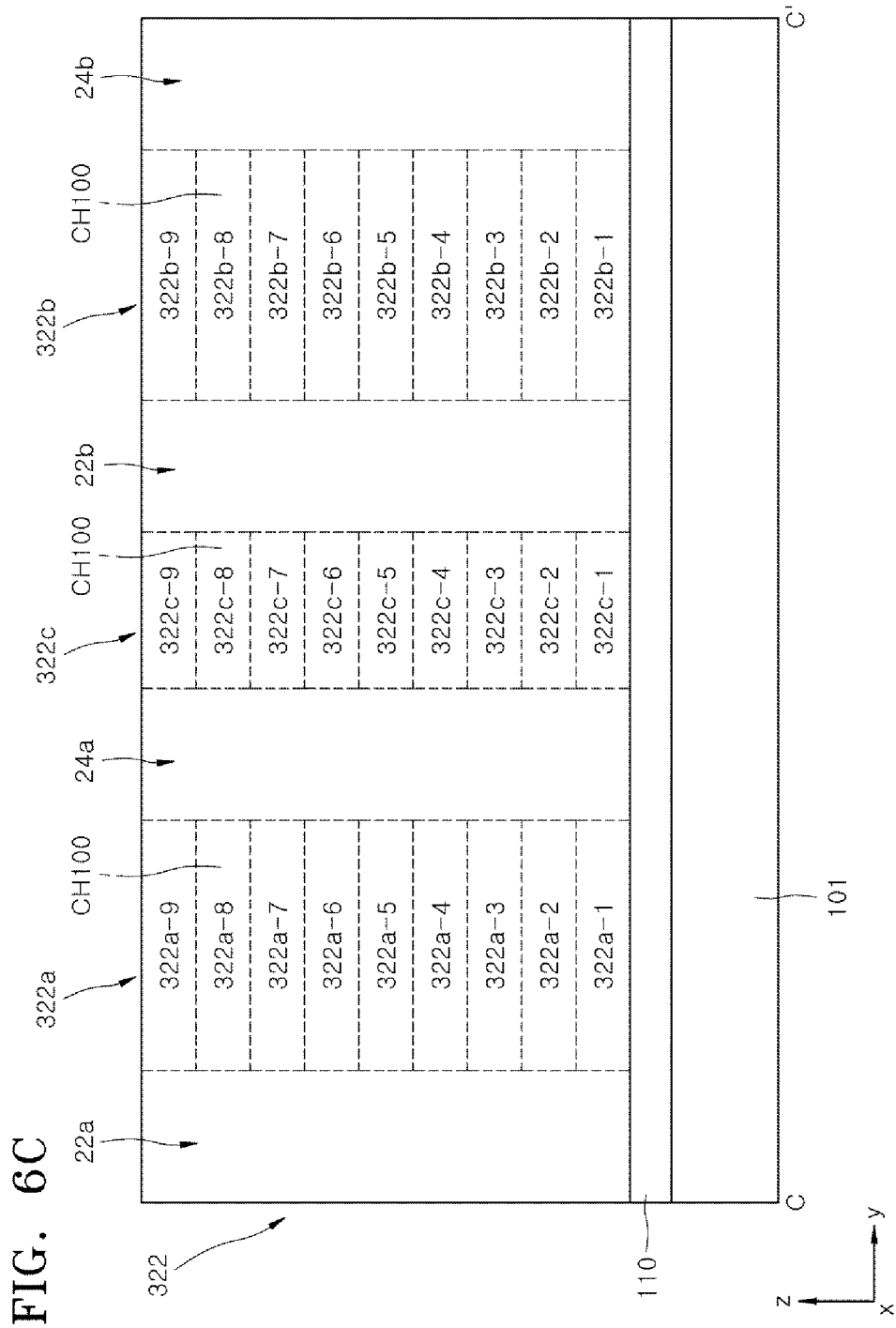

NONVOLATILE MEMORY DEVICE HAVING A FERROELECTRIC LAYER

CROSS-REFERENCE TO RELATED APPLICATION

The present application claims priority under 35 U.S.C. § 119(a) to Korean Patent Application No. 10-2019-0163139, filed on Dec. 9, 2019, which is herein incorporated by reference in its entirety.

BACKGROUND

1. Technical Field

The present disclosure relates generally to a nonvolatile memory device and, more particularly, to a nonvolatile memory device having a ferroelectric layer.

2. Related Art

As the design rule decreases and the degree of integration increases, research has continued on the structures of semiconductor devices that can guarantee both structural stability and reliability of signal storage operations. Currently, a flash memory device with a charge storage scheme using a three-layer stacked structure of a charge tunneling layer, a charge trap layer, and a charge barrier layer has been widely utilized.

Recently, various nonvolatile memory devices having different structures from existing flash memory devices have been proposed. An example of a nonvolatile memory device is a ferroelectric memory device of a transistor structure. The ferroelectric memory device can non-volatilely store any one of remanent polarization having different sizes and orientations as signal information in a gate ferroelectric layer. In addition, the signal information may be read out by using a feature in which the magnitude of the operation current flowing through a channel layer between source and drain electrodes changes according to the stored remanent polarization.

SUMMARY

A nonvolatile memory device according to an aspect of the present disclosure includes a substrate having an upper surface, and a gate structure disposed over the substrate. The gate structure includes at least one gate electrode layer pattern and at least one gate insulation layer pattern, which are alternately stacked along a first direction perpendicular to the upper surface. The gate structure extends in a second direction perpendicular to the first direction. In addition, the nonvolatile memory device includes a ferroelectric layer disposed on at least a portion of one sidewall surface of the gate structure over the substrate. The one sidewall surface of the gate structure is a plane defined by the first and second directions. The nonvolatile memory device includes a channel layer disposed over the substrate and disposed on the ferroelectric layer, and a source electrode structure and a drain electrode structure each disposed over the substrate and disposed to contact the channel layer. The source electrode structure and the drain electrode structure are spaced apart from each other in the second direction.

A nonvolatile memory device according to another aspect of the present disclosure includes a substrate having an upper surface, and a gate structure disposed over the substrate. The gate structure includes at least one gate electrode layer pattern and at least one gate insulation layer pattern, which are alternately stacked along a first direction perpendicular to the upper surface. The gate structure extends in a second direction perpendicular to the first direction. The nonvolatile memory device includes a ferroelectric layer disposed on at least a portion of one sidewall surface of the gate structure, over the substrate. The one sidewall surface of the gate structure forms a plane substantially parallel to the first and second directions. The nonvolatile memory device includes a source electrode structure and a drain electrode structure disposed on the ferroelectric layer spaced apart from each other in the second direction, and a channel structure disposed over the substrate and disposed between the source electrode structure and the drain electrode structure. Each of the source electrode structure and the drain electrode structure is disposed on the ferroelectric layer.

A nonvolatile memory device according to another aspect of the present disclosure includes a substrate, and a gate structure disposed over the substrate having an upper surface. The gate structure includes at least one gate functional layer pattern and at least one gate insulation layer pattern, which are alternately stacked along a first direction perpendicular to the upper surface. The gate structure extends in a second direction perpendicular to the first direction. The nonvolatile memory device includes an interfacial insulation layer and a channel layer, which are sequentially disposed on one sidewall surface of the gate structure. The one sidewall surface of the gate structure is a plane defined by the first and second directions. The nonvolatile memory device includes a source electrode structure and a drain electrode structure spaced apart from each other in the second direction. Each of the source electrode structure and the drain electrode structure contacts the channel layer. The gate functional layer pattern includes a floating electrode layer part disposed on the interfacial insulation layer and the gate insulation layer pattern, a ferroelectric layer part disposed on the floating electrode layer part, and the interfacial insulation layer, and a gate electrode layer part disposed to contact the ferroelectric layer part.

BRIEF DESCRIPTION OF THE DRAWINGS

FIG. 6C is a cross-sectional view taken along a line C-C' of FIG. 6B.

DETAILED DESCRIPTION

Figure 1:
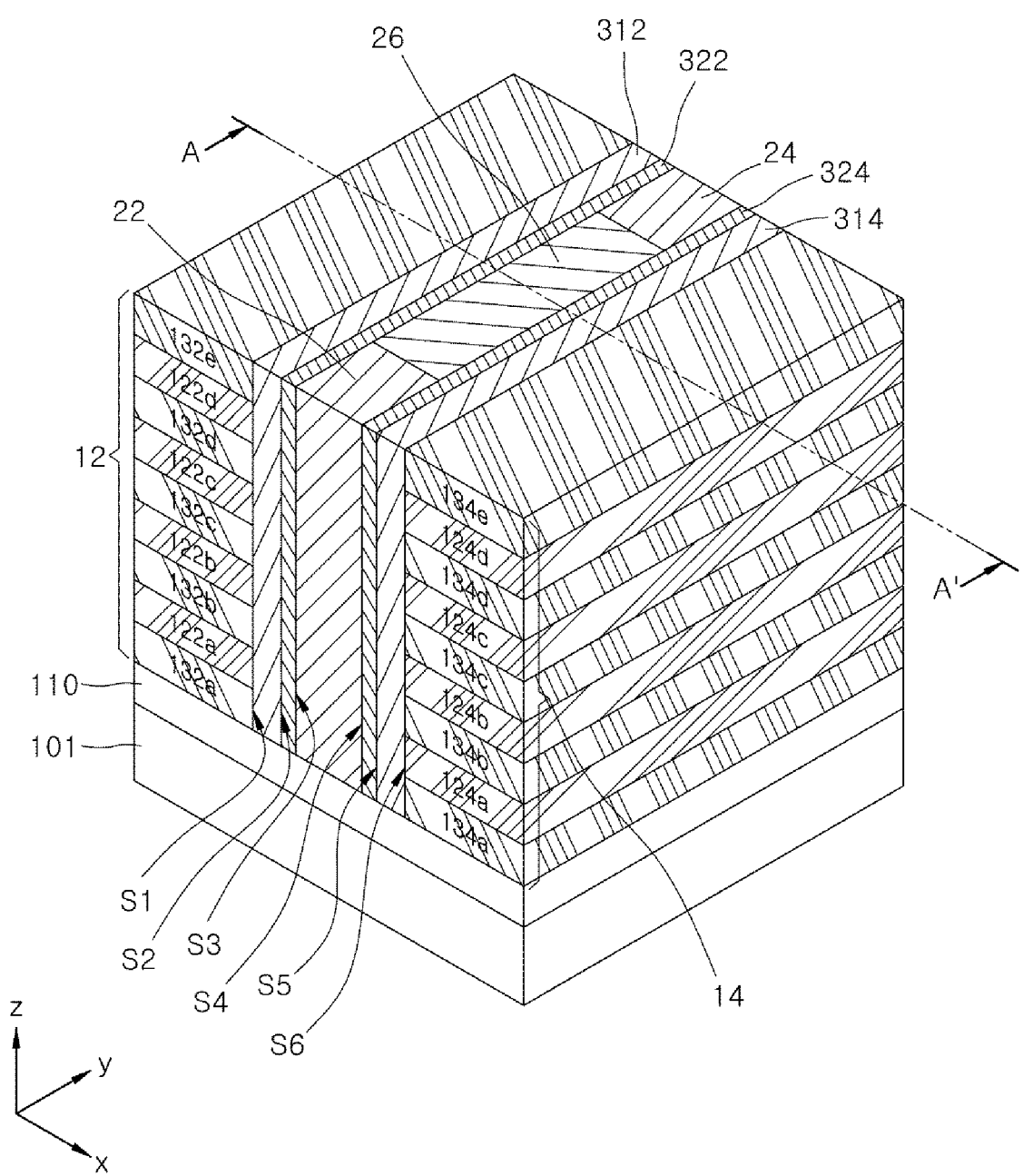
FIG. 1 is a perspective view schematically illustrating a nonvolatile memory device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise" or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

In this specification, the term "a predetermined direction" may mean a direction encompassing one direction determined in a coordinate system and a direction opposite to the one direction. As an example, in the x-y-z coordinate system, the z-direction may mean all of a direction in which an absolute value of the z-axis increases in a positive direction along the z-axis from the origin 0 and a direction in which an absolute value of the z-axis increases in a negative direction along the z-axis from the origin 0. The x-direction and the y-direction may each be interpreted in substantially the same way in the x-y-z coordinate system.

Figure 2:
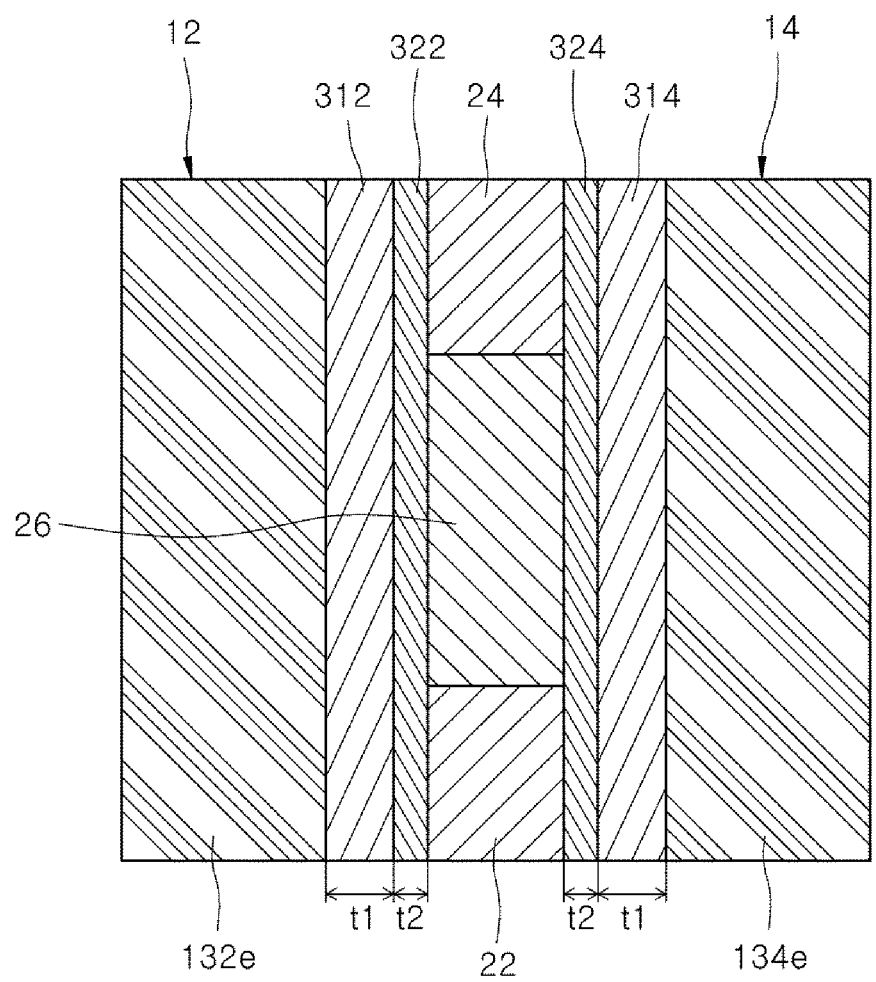
FIG. 2 is a plan view of the nonvolatile memory device of FIG. 1.
Figure 3:
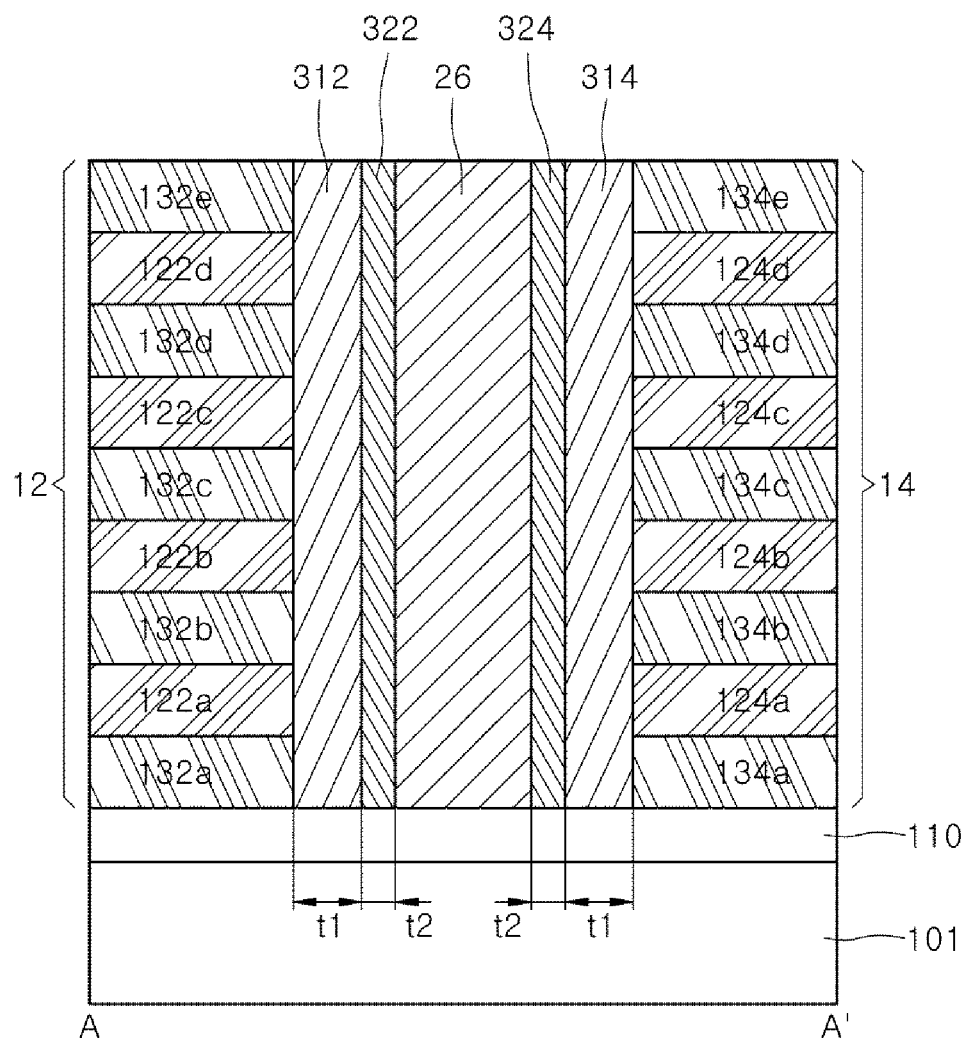
FIG. 3 is a cross-sectional view taken along a line A-A' of the nonvolatile memory device of FIG. 1.

FIG. 1 is a perspective view schematically illustrating a nonvolatile memory device 1 according to an embodiment of the present disclosure. FIG. 2 is a plan view of the nonvolatile memory device of FIG. 1. FIG. 3 is a cross-sectional view taken along a line A-A' of the nonvolatile memory device of FIG. 1.

Referring to FIGS. 1 to 3, the nonvolatile memory device 1 may include a substrate 101, first and second gate structures 12 and 14, a source electrode structure 22, a drain electrode structure 24, first and second ferroelectric layers 312 and 314, and first and second channel layers 322 and 324. In addition, the nonvolatile memory device 1 may further include a base insulation layer 110 disposed on the substrate 101 and an insulation structure 26 extending in a first direction (i.e., the z-direction) perpendicular to the substrate 101. A memory device structure including the first gate structure 12, the first ferroelectric layer 312 and the first channel layer 322 may share the source electrode structure 22, the drain electrode structure 24 and the insulation structure 26 with a memory device structure including the second gate structure 14, the second ferroelectric layer 314 and the second channel layer 324.

The substrate 101 may include a semiconductor material. Specifically, the semiconductor material may include silicon (Si), germanium (Ge), gallium arsenide (GaAs), and the like. The substrate 101 may be doped with an n-type dopant or a p-type dopant. As an example, the substrate 101 may include a well region doped with an n-type dopant or a p-type dopant.

The base insulation layer 110 may be disposed on the substrate 101. The base insulation layer 110 may electrically insulate the first and second gate structures 12 and 14, the first and second ferroelectric layers 312 and 314, the first and second channel layers 322 and 324, the source electrode structure 22, and the drain electrode structure 24 from the substrate 101, respectively.

Although not illustrated in FIG. 1, at least one conductive layer and at least one insulation layer may be disposed between the substrate 101 and the base insulation layer 110. The conductive layer and the insulation layer may form various circuit patterns. That is, the conductive layer and the insulation layer may form a plurality of wirings or may constitute a passive element such as a capacitor or a resistor, or an active element such as a diode or a transistor, by way of non-limiting examples.

Referring to FIG. 1, the first gate electrode structure 12 may be disposed on the base insulation layer 110. The first gate electrode structure 12 may include first to fourth gate electrode layer patterns 122a, 122b, 122c and 122d and first to fifth gate insulation layer patterns 132a, 132b, 132c, 132d and 132e, which are alternately stacked along the first direction (i.e., the z-direction) perpendicular to the substrate 101, on the base insulation layer 110. The first gate insulation layer pattern 132a may be disposed to contact the base insulation layer 110. The fifth gate insulation layer pattern 132e may be disposed as an uppermost layer of the first gate electrode structure 12.

The first gate electrode structure 12 may extend in a second direction (i.e., the y-direction) perpendicular to the first direction. The first to fourth gate electrode layer patterns 122a, 122b, 122c and 122d may be electrically insulated from each other by the first to fifth gate insulation layer patterns 132a, 132b, 132c, 132d and 132e. The first to fourth gate electrode layer patterns 122a, 122b, 122c and 122d may be conductive lines extending in the second direction (i.e., the y-direction). The first to fourth gate electrode layer patterns 122a, 122b, 122c and 122d may each maintain a predetermined potential.

In an embodiment, the first to fourth gate electrode layer patterns 122a, 122b, 122c and 122d may each include a conductive material. The conductive material may, for example, include a doped semiconductor material, metal, conductive metal silicide, conductive metal nitride, or conductive metal oxide. The conductive material may, for example, include n-type doped silicon, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The first to fifth gate insulation layer patterns 132a, 132b, 132c, 132d and 132e may each include an insulative material. The insulative material may, for example, include oxide, nitride, oxynitride, and the like.

In some other embodiments, the number of the gate electrode layer patterns of the first gate electrode structure 12 may not necessarily be limited to four. The gate electrode layer patterns may be disposed in different various numbers, and the gate insulation layer patterns may insulate the various numbers of source electrode layer patterns along the first direction (i.e., the z-direction).

Referring to FIGS. 1 to 3, the first ferroelectric layer 312 may be disposed on the base insulation layer 110 and on one sidewall surface S1 of the first gate structure 12. Here, the one sidewall surface S1 may form a plane substantially parallel to the first and second directions (i.e., a y-z plane to the z-direction and y-direction). The first ferroelectric layer 312 may have a predetermined thickness t1 along a third direction (i.e., the x-direction) perpendicular to the first and second directions. The thickness t1 may, for example, be 1 nanometers (nm) to 50 nanometers (nm), inclusive.

The first ferroelectric layer 312 may include a ferroelectric material. The ferroelectric material may have electrical remanent polarization in a state where no external electric field is applied. In addition, in the ferroelectric material, when an external electric field is applied, the electrical polarization may exhibit a hysteresis behavior. By controlling the external electric field, one of a plurality of stable polarization states on the polarization hysteresis curve can be written in the ferroelectric material. After the external electric field is removed from the ferroelectric material, the written polarization can be stored in the ferroelectric material in a form of remanent polarization. The remanent polarization may be used in nonvolatile storage for a plurality of pieces of signal information. The first ferroelectric layer 312 may, for example, include hafnium oxide, zirconium oxide, hafnium zirconium oxide, and the like. The first ferroelectric layer 312 may have a crystal structure of an orthorhombic system.

The first channel layer 322 may be disposed on the base insulation layer 110 and contact the first ferroelectric layer 312. Specifically, the first channel layer 322 may be disposed on one surface S2 of the first ferroelectric layer 312 defined by the first and second directions (i.e., the z-direction and y-direction). The first channel layer 322 may have a predetermined thickness t2 along the third direction (i.e., the x-direction). The thickness t2 may, for example, be 1 nanometers (nm) to 50 nanometers (nm), inclusive. Although the thickness of the first ferroelectric layer 312 is illustrated to be greater than the thickness of the first channel layer 322 in FIG. 3, the thickness of the first ferroelectric layer 312 is not limited thereto, and in other embodiments the thickness of the first ferroelectric layer 312 may be less than or equal to the thickness of the first channel layer 322.

The first channel layer 322 may provide a path through which electrical carriers such as electrons or holes move between the source electrode structure 22 and the drain electrode structure 24. The electrical resistance of the first channel layer 322 may be reduced when a conductive channel is formed in the first channel layer 322, as described later. However, the electrical resistance of the conductive channel may also vary depending on the size and direction of the remanent polarization stored in the first ferroelectric layer 312.

The first channel layer 322 may include, for example, a doped semiconductor material or metal oxide. The semiconductor material may, for example, include silicon (Si), germanium (Ge), gallium arsenide (GaAs), and the like. The metal oxide may include indium-gallium-zinc (In—Ga—Zn) oxide. In an embodiment, the first channel layer 322 may include silicon (Si) doped with an n-type dopant. Alternatively, the first channel layer 322 may include c-axis aligned indium-gallium-zinc (In—Ga—Zn) oxide. The first channel layer 322 may have a single crystal structure or a polycrystalline structure.

Referring to FIGS. 1 to 3 again, the source electrode structure 22 and the drain electrode structure 24 may each be disposed on the base insulation layer 110 to contact surface S3 of the first channel layer 322, while being spaced apart from each other in the second direction (i.e., the y-direction). The source electrode structure 22 and the drain electrode structure 24 may each have a pillar-like shape extending along the first direction (i.e., the z-direction). The source electrode structure 22 and the drain electrode structure 24 may each be disposed to contact the first channel layer 322 and the second channel layer 324.

The insulation structure 26 may be disposed between the source electrode structure 22 and the drain electrode structure 24. The insulation structure 26 may be disposed to contact the first channel layer 322 and the second channel layer 324. The insulation structure 26 may have a pillar-like shape extending in the first direction (i.e., z-direction) from the base insulation layer 110. The insulation structure 26 may play a role in inhibiting the movement of the electrical carriers between the source electrode structure 22 and the drain electrode structure 24 through paths other than the first channel layer 322 or the second channel layer 324.

The source electrode structure 22 and the drain electrode structure 24 may each maintain a predetermined electric potential. The electric potential of each of the source electrode structure 22 and the drain electrode structure 24 may be the same or different from each other. In an embodiment, during an operation of the nonvolatile memory device, if a conductive channel is formed in the first channel layer 322 or the second channel layer 324 and a predetermined potential difference occurs between the source electrode structure 22 and the drain electrode structure 24, the electrical carriers may move through the conductive channel.

The source electrode structure 22 and the drain electrode structure 24 may each include a conductive material. The conductive material may, for example, include a doped semiconductor material, metal, conductive metal nitride, conductive metal oxide, conductive metal carbide, conductive metal silicide, and the like. The conductive material may, for example, include doped silicon, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The insulation structure 26 may include oxide, nitride, or oxynitride. As an example, the insulation structure 26 may include silicon oxide, silicon nitride, or silicon oxynitride.

Referring to FIGS. 1 to 3, the second channel layer 324 may be disposed on the base insulation layer 110 and may contact sidewalls of the source electrode structure 22, drain electrode structure 24 and insulation structure 26. Sidewalls of the source electrode structure 22, drain electrode structure 24 and insulation structure 26 may be positioned on the same plane S4. The plane S4 may form a plane substantially parallel to the first and second directions (i.e., a y-z plane parallel to the z-direction and y-direction). The second channel layer 324 may have a predetermined thickness t2 along the third direction (i.e., the x-direction). The configuration of the second channel layer 324 may be substantially the same as the configuration of the first channel layer 322.

The second ferroelectric layer 314 may be disposed on the base insulation layer 110 and on one surface S5 of the second channel layer 324. The one surface S5 may be a plane defined by the first and second directions (i.e., a y-z plane parallel to the z-direction and y-direction). The second ferroelectric layer 314 may have a predetermined thickness t1 along the third direction (i.e., the x-direction). The configuration of the second ferroelectric layer 314 may be substantially the same as the configuration of the first ferroelectric layer 312.

The second gate structure 14 may be disposed on the base insulation layer 110 and contact one surface S6 of the second ferroelectric layer 314. The plane S6 may form a plane substantially parallel to the first and second directions (i.e., a y-z plane parallel to the z-direction and y-direction). The second gate structure 14 may include first to fourth gate electrode layer patterns 124a, 124b, 124c and 124d and first to fifth gate insulation layer patterns 134a, 134b, 134c, 134d and 134e, which are alternately stacked along the first direction (i.e., the z-direction). The first gate insulation layer pattern 134a may be disposed to contact the base insulation layer 110. The fifth gate insulation layer pattern 134e may be disposed as the uppermost layer of the second gate structure 14. The second gate structure 14 may extend in the second direction (i.e., the y-direction). The configurations of the first to fourth gate electrode layer patterns 124a, 124b, 124c and 124d and the first to fifth gate insulation layer patterns 134a, 134b, 134c, 134d and 134e of the second gate structure 14 may be substantially the same as the configurations of the first to fourth gate electrode layer patterns 122a, 122b, 122c and 122d and the first to fifth gate insulation layer patterns 132a, 132b, 132c, 132d and 132e of the first gate structure 12.

As described above, in the nonvolatile memory device 1 according to an embodiment of the present disclosure, the first gate structure 12 and the second gate structure 14 may be disposed symmetrically with respect to each other across a y-z plane centered on the source electrode structure 22, the insulation structure 26, and the drain electrode structure 24. Similarly, the first ferroelectric layer 312 and the second ferroelectric layer 314 may be disposed symmetrically with respect to each other, and the first channel layer 322 and the second channel layer 324 may be disposed symmetrically with respect to each other.

In an embodiment, the first gate structure 12, the first ferroelectric layer 312, the first channel layer 322, the source electrode structure 22 and the drain electrode structure 24 may constitute one operation unit of the nonvolatile memory device 1, and the second gate structure 14, the second ferroelectric layer 314, the second channel layer 324, the source electrode structure 22 and the drain electrode structure 24 may constitute another operation unit of the nonvolatile memory device 1. The source electrode structure 22 and the drain electrode structure 24 may be shared by the different operation units. That is, the first to fourth gate electrode layer patterns 122a, 122b, 122c and 122d of the first gate structure 12, the first ferroelectric layer 312 and the first channel layer 322 may operate together with the source electrode structure 22 and the drain electrode structure 24. In addition, the first to fourth gate electrode layer patterns 124a, 124b, 124c and 124d of the second gate structure 14, the second ferroelectric layer 314 and the second channel layer 324 may operate together with the source electrode structure 22 and the drain electrode structure 24.

Figure 4A:
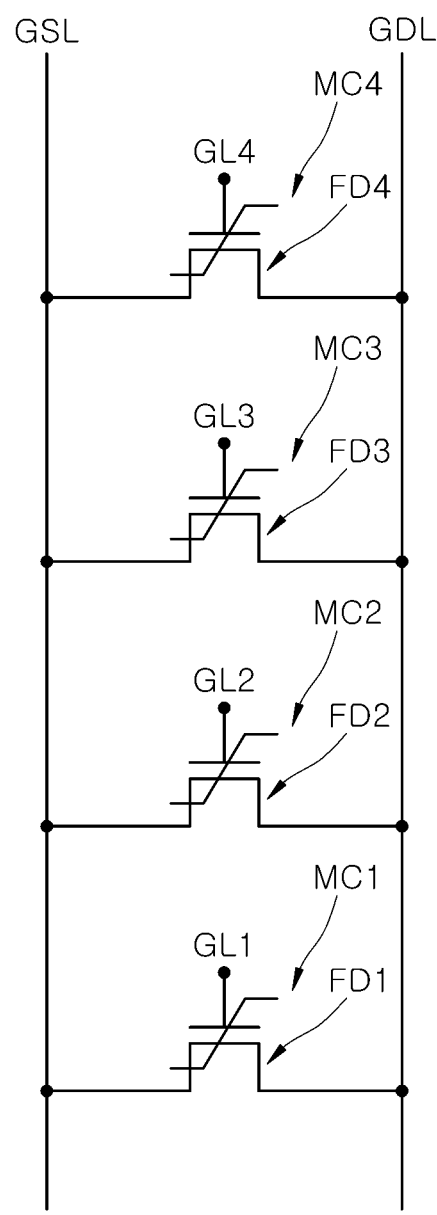
FIGS. 4A to 4E are views schematically illustrating an operation of a nonvolatile memory device according to an embodiment of the present disclosure.
Figure 4B:
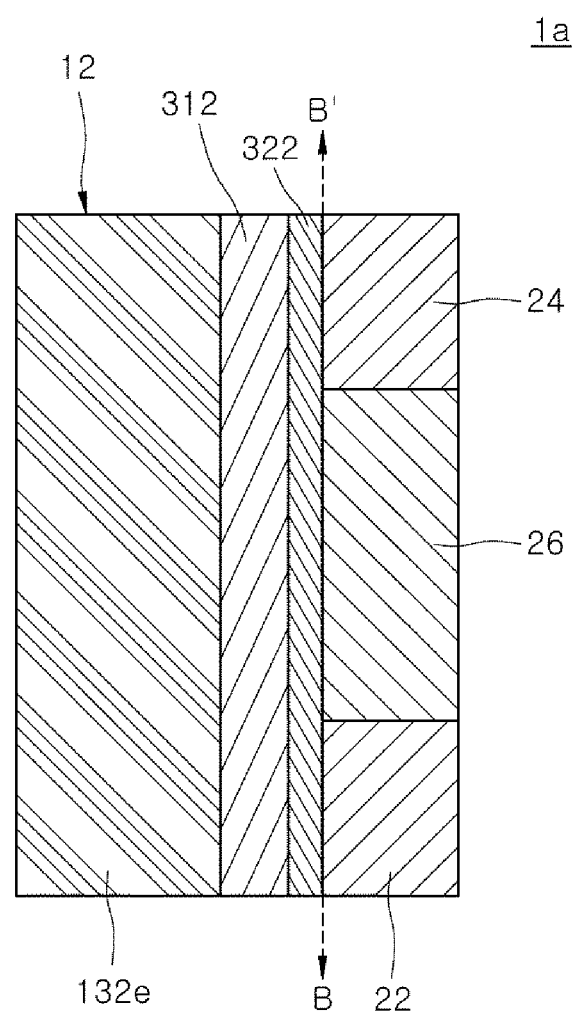
Figure 4C:
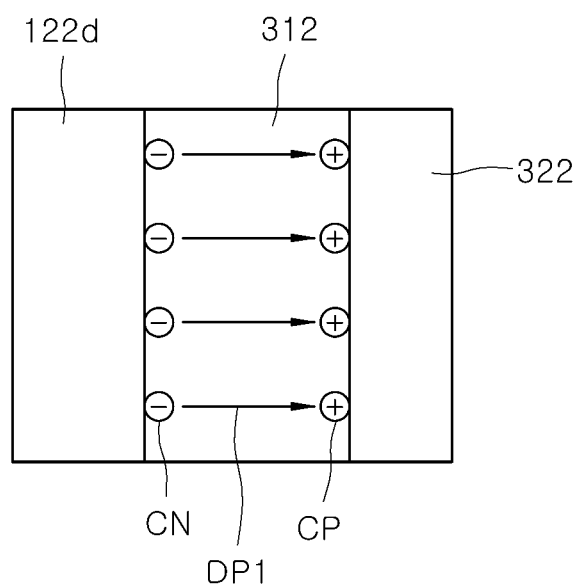
Figure 4D:
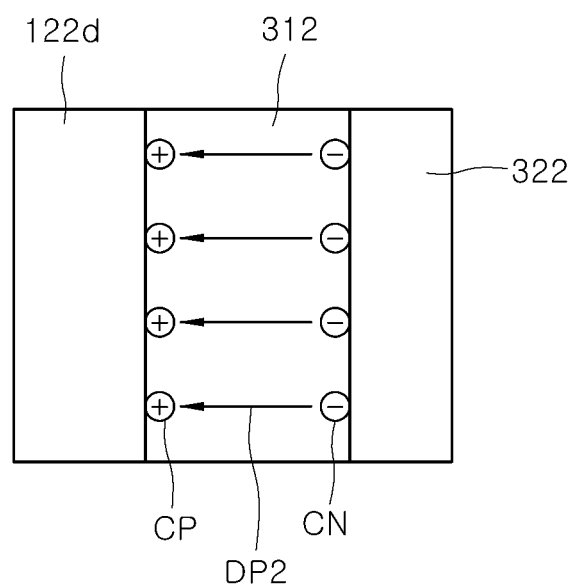
Figure 4E:
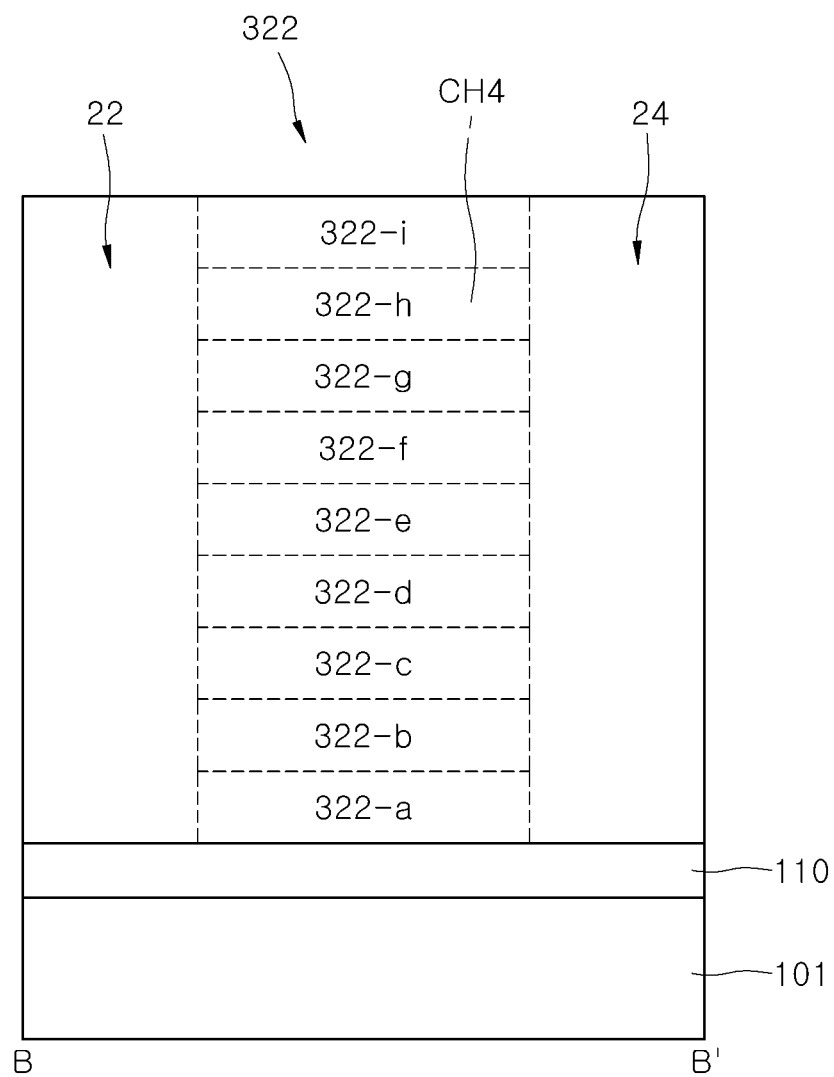

FIGS. 4A to 4E are views schematically illustrating an operation of a nonvolatile memory device according to an embodiment of the present disclosure. FIG. 4A is a circuit diagram of a nonvolatile memory device according to an embodiment of the present disclosure. FIG. 4B is a plan view of a portion of the nonvolatile memory device corresponding to the circuit diagram of FIG. 4A. FIGS. 4C and 4D are views schematically illustrating different remanent polarization stored in a ferroelectric layer of a nonvolatile memory device according to an embodiment of the present disclosure. FIG. 4E is a cross-sectional view taken along a line B-B' of FIG. 4B.

Specifically, FIG. 4B is a plan view schematically illustrating one operation unit 1a of the nonvolatile memory device 1 described above with reference to FIGS. 1 to 3. The one operation unit 1a may, for example, include a first gate structure 12, a first ferroelectric layer 312, a first channel layer 322, a source electrode structure 22, a drain electrode structure 24 and an insulation structure 26. For the convenience of explanation related to the operation of the one operation unit 1a, the uppermost gate insulation layer pattern 134e of the first gate structure 12 is omitted in FIG. 4B.

Referring to FIG. 4A, first to fourth memory cells MC1, MC2, MC3 and MC4 are disclosed. The first to fourth memory cells MC1, MC2, MC3 and MC4 may each have a form of a transistor and include first to fourth ferroelectric layers FD1, FD2, FD3 and FD4 functioning as memory layers, respectively.

A source and a drain of each of the first to fourth memory cells MC1, MC2, MC3 and MC4 may be electrically connected to a global source line (GSL) and a global drain line (GDL). Gate electrodes of the first to fourth memory cells MC1, MC2, MC3 and MC4 may be electrically connected to first to fourth word lines GL1, GL2, GL3 and GL4, respectively.

In relation to a write operation for at least one memory cell of the first to fourth memory cells MC1, MC2, MC3 and MC4, first, at least one of the first to fourth word lines GL1, GL2, GL3 and GL4 may be selected. A polarization switching voltage having a magnitude greater than or equal to a predetermined threshold voltage may be applied to both ends of each of the first to fourth ferroelectric layers FD1, FD2, FD3 and FD4 of the corresponding first to fourth memory cells MC1, MC2, MC3 and MC4, through the at least one selected word line. At this time, the global source line GSL and the global drain line GDL may be grounded. By applying a polarization switching voltage, the polarization of the first to fourth ferroelectric layers FD1, FD2, FD3 and FD4 may be switched and then aligned in a predetermined direction. After the polarization switching voltage is removed, the switched polarization may be stored in the corresponding first to fourth ferroelectric layers FD1, FD2, FD3 and FD4 in the form of remanent polarization. As a result, as described above, the polarization switching voltage is applied through at least one word line of the first to fourth word lines GL1, GL2, GL3 and GL4, so that a write operation may be performed on at least one of the first to fourth memory cells MC1, MC2, MC3 and MC4. After the write operation is completed, a predetermined signal may be stored in the corresponding memory cell in a nonvolatile manner.

Meanwhile, an operation of reading the signal non-volatilely stored in the first to fourth memory cells MC1, MC2, MC3 and MC4 may be performed. As an exemplary example, a process of reading a signal stored in the fourth memory cell MC4 will be described. First, the fourth word line GL4 corresponding to the fourth memory cell MC4 is selected. Subsequently, a read voltage greater than or equal to a predetermined threshold voltage may be applied to a gate electrode of the fourth memory cell MC4 through the fourth word line GL4. An absolute value of the read voltage may be smaller than an absolute value of the polarization switching voltage. That is, the polarization inside the fourth ferroelectric layer FD4 may not be switched by the read voltage. The transistor of the fourth memory cell MC4 is tuned on by the read voltage, and a conductive channel may be formed in the channel layer of the transistor. As a result, when a source-drain potential difference is formed between the global source line GSL and the global drain line GDL, a source-drain current may flow through the conductive channel.

The source-drain current may vary according to the orientation and size of the remanent polarization stored in the fourth ferroelectric layer FD4. As an example, when the remanent polarization is oriented from the gate electrode toward the channel layer (corresponding to a first polarization DP1 in FIG. 4C), positive charges are accumulated inside the fourth ferroelectric layer FD4 adjacent to the channel layer, thereby increasing the electron density of the conductive channel. Accordingly, the magnitude of the current flowing along the conductive channel may be increased. As another example, when the remanent polarization is oriented from the channel layer toward the gate electrode (corresponding to a second polarization DP2 in FIG. 4D), negative charges are accumulated inside the fourth ferroelectric layer FD4 adjacent to the channel layer, thereby reducing the electron density of the conductive channel. Accordingly, the magnitude of the current flowing along the conductive channel may be reduced. As described above, the signal stored in the memory cell can be read by turning on the transistor of the memory cell to be read and measuring the current flowing through the channel layer.

In other embodiments, the number of the memory cells disposed between the global source line GSL and the global drain line GDL is not necessarily limited to four, and other various numbers are possible. Similarly, the number of the word lines is not necessarily limited to four, and various other numbers are possible.

Referring to FIG. 4B, the global source line GSL described above with reference to FIG. 4A may correspond to the source electrode structure 22, and the global drain line GDL may correspond to the drain electrode structure 24. Also, the first to fourth word lines GLS, GL2, GL3 and GL4 may correspond to the first to fourth gate electrode layer patterns 122a, 122b, 122c and 122d of the first gate structure 12 in FIGS. 1-3. Accordingly, the fourth word line GL4 and the fourth ferroelectric layer FD4 of the fourth memory cell MC4 illustrated in FIG. 4A may correspond to the fourth gate electrode layer pattern 122d and a region of the first ferroelectric layer 312 covered by the fourth gate electrode layer pattern 122d illustrated in FIG. 4B. Referring to FIGS. 4B and 4E, a channel layer of the fourth memory cell MC4 illustrated in FIG. 4A may correspond to an eight region 322-h of the first channel layer 322, between source electrode structure 22 and drain electrode structure 24, covered by the fourth gate electrode layer pattern 122d. Referring to FIGS. 1 to 3 and FIG. 4E, the first channel layer 322 may include first to ninth regions 322-a, 322-b, 322-c, 322-d, 322-e, 322-f, 322-g, 322-h and 322-i that correspond to regions overlapping, between source electrode structure 22 and drain electrode structure 24, the first to fourth gate electrode layer patterns 122a, 122b, 122c and 122d and the first to fifth gate insulation layer patterns 132a, 132b, 132c, 132d and 132e along the third direction (i.e., the x-direction). As an example, the channel layers of the first to third memory cells MC1, MC2 and MC3 illustrated in FIG. 4A may correspond to the second region 322-b, the fourth region 322-d and the sixth region 322-f of the first channel layer 322 in FIG. 4E.

Hereinafter, as an example, a write operation and a read operation for the memory cell structure including the fourth gate electrode layer pattern 122d, the first ferroelectric layer 312, the eighth portion 322-h of the first channel layer 322 illustrated in FIGS. 4B to 4E corresponding to the fourth memory cell MC4 of the nonvolatile memory device illustrated in FIG. 4A will be described. Substantially the same write and read operations may be applied to the memory cell structures of FIGS. 4B to 4E corresponding to the first to third memory cells MC1, MC2 and MC3.

The write operation for the fourth memory cell MC4 may be described using FIGS. 4B to 4D. Referring to FIG. 4B, the fourth gate electrode layer pattern 122d is selected from the first to fourth gate electrode layer patterns 122a, 122b, 122c and 122d of the first gate structure 12. Subsequently, the source electrode structure 22 and the drain electrode structure 24 are grounded, and a first polarization switching voltage having a positive polarity is applied to the fourth gate electrode layer pattern 122d. The first polarization switching voltage may be a voltage having an absolute value equal to or greater than a predetermined threshold voltage, such that the polarization orientation of the first ferroelectric layer 312 can be switched. When the first polarization switching voltage is applied, as illustrated in FIG. 4C, a first polarization DP1 may be formed in a region of the first ferroelectric layer 312 covered by or common to the fourth gate electrode layer pattern 122d. The first polarization DP1 may be oriented from an interface region of the first ferroelectric layer 312 contacting the fourth gate electrode layer pattern 122d towards an interface region of the first ferroelectric layer 312 contacting the first channel layer 322. Subsequently, the first polarization switching voltage is removed. Even after the first polarization switching voltage is removed, the first polarization DP1 may be stored in the form of remanent polarization. In addition, the first polarization DP1 is formed, so that positive charges CP and negative charges CN may be generated in the inner region of the first ferroelectric layer 312. Even after the first polarization switching voltage is removed, the positive charges CP may be distributed in the interface region of the first ferroelectric layer 312 in contact with the first channel layer 322, and the negative charges CN may be distributed in the interface region of the first ferroelectric layer 312 in contact with the fourth gate electrode layer pattern 122d.

As another embodiment, in FIG. 4B, the fourth gate electrode layer pattern 122d is selected from the first to fourth gate electrode layer patterns 122a, 122b, 122c and 122d. Subsequently, after the source electrode structure 22 and the drain electrode structure 24 are grounded, a second polarization switching voltage having a negative polarity is applied to the fourth gate electrode layer pattern 122d. The second polarization switching voltage may be a voltage having an absolute value equal to or greater than a predetermined threshold voltage to switch the polarization orientation of the first ferroelectric layer 312. When the second polarization switching voltage is applied, as described in FIG. 4D, a second polarization DP2 may be formed in an inner region of the first ferroelectric layer 312 covered by the fourth gate electrode layer pattern 122d. The second polarization DP2 may be oriented from the interface region of the first ferroelectric layer 312 contacting the first channel layer 322 towards the interface region of the first ferroelectric layer 312 contacting the fourth gate electrode layer pattern 122d. Subsequently, the second polarization switching voltage is removed. Even after the second polarization switching voltage is removed, the second polarization DP2 may be stored in the form of remanent polarization. In addition, the second polarization DP2 is formed, so that positive charges CP and negative charges CN may be generated in the inner region of the first ferroelectric layer 312. Even after the second polarization switching voltage is removed, the positive charges CP may be distributed in the interface region of the first ferroelectric layer 312 contacting the fourth gate electrode layer pattern 122d, and the negative charges CN may be distributed in the interface region of the first ferroelectric layer 312 contacting the first channel layer 322. As described above, the write operation can be performed through the switching operation of the polarization orientation of the first ferroelectric layer 312 described above with reference to FIGS. 4B to 4D. As an example, the first polarization DP1 forming operation related to FIG. 4C may be referred to as a program operation, and the second polarization DP2 forming operation related to FIG. 4D may be referred to as an erase program.

Meanwhile, a read operation on the signal information stored in the fourth memory cell MC4 will be described with reference to FIGS. 4B and 4E. First, a read voltage having an absolute value equal to or greater than a predetermined threshold voltage is applied to the fourth gate electrode layer pattern 122d. The absolute value of the read voltage may be smaller than the absolute value of the first and second polarization switching voltages. That is, the polarization of the first ferroelectric layer 312 covered by the fourth gate electrode layer pattern 122d may not be switched by the read voltage.

Instead, a conductive channel CH4 may be formed in the eighth region 322-h of the first channel layer 322 adjacent to the first ferroelectric layer 312 by the read voltage. Referring to FIG. 4E, the conductive channel CH4 may electrically connect the source electrode structure 22 to the drain electrode structure 24. The electron density inside the conductive channel CH4 may be higher than the electron density of the first channel layer 322 outside the conductive channel CH4.

After the conductive channel CH4 is formed, a source-drain potential difference is formed between the source electrode structure 22 and the drain electrode structure 24. As an example, after the source electrode structure 22 is grounded, a drain voltage having a positive polarity may be applied to the drain electrode structure 24. Accordingly, electrons may flow from the source electrode structure 22 to the drain electrode structure 24 through the conductive channel CH4. At this time, the current density generated by the flow of the electrons may be influenced by the orientation of the remanent polarization stored in the adjacent first ferroelectric layer 312. When the orientation of the remanent polarization is the same as that of the first polarization DP1 of FIG. 4C, the electron density inside the conductive channel CH4 increases, so that the current density flowing along the conductive channel CH4 may increase. Conversely, when the orientation of the remanent polarization is the same as that of the second polarization DP2 in FIG. 4D, the electron density inside the conductive channel CH4 decreases, so that the current density flowing along the conductive channel CH4 may decrease. As described above, by forming a conductive channel in a channel layer of a memory cell to be read, and by measuring the current flowing through the conductive channel, the signal stored in the memory cell can be read.

According to an embodiment of the present disclosure, a nonvolatile memory device may include a gate structure, a source electrode structure and a drain electrode structure disposed in a direction perpendicular to a substrate. In addition, the nonvolatile memory device may include a ferroelectric layer and a channel layer disposed adjacent to the gate structure, the source electrode structure and the drain electrode structure. In the nonvolatile memory device, a plurality of memory cells may be randomly accessed through independently selectable gate electrode layer patterns. Through this, the nonvolatile memory device can independently perform write and read operations on the accessed memory cell.

Figure 5:
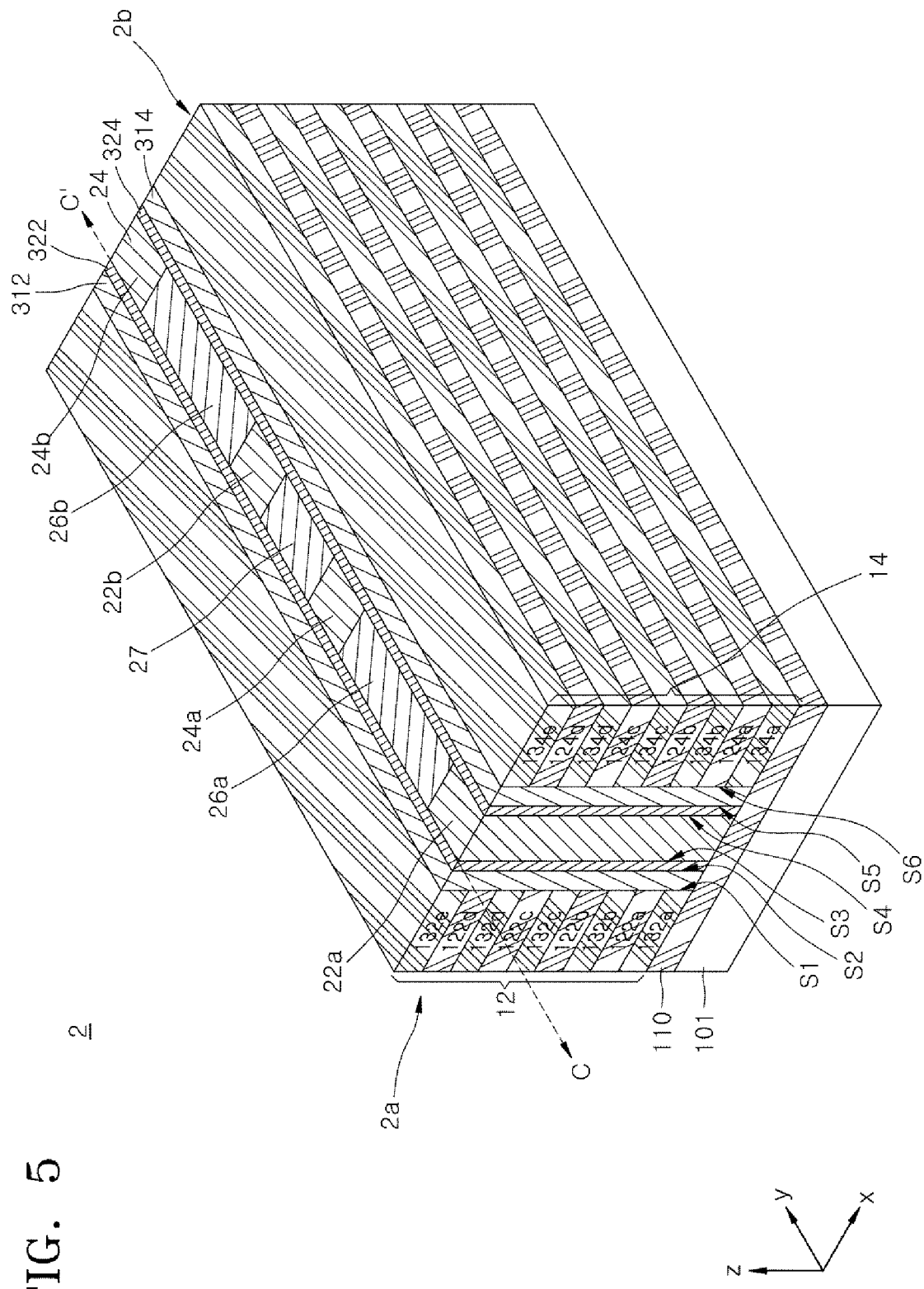
FIG. 5 is a perspective view schematically illustrating a nonvolatile memory device according to another embodiment of the present disclosure.
Figure 6A:
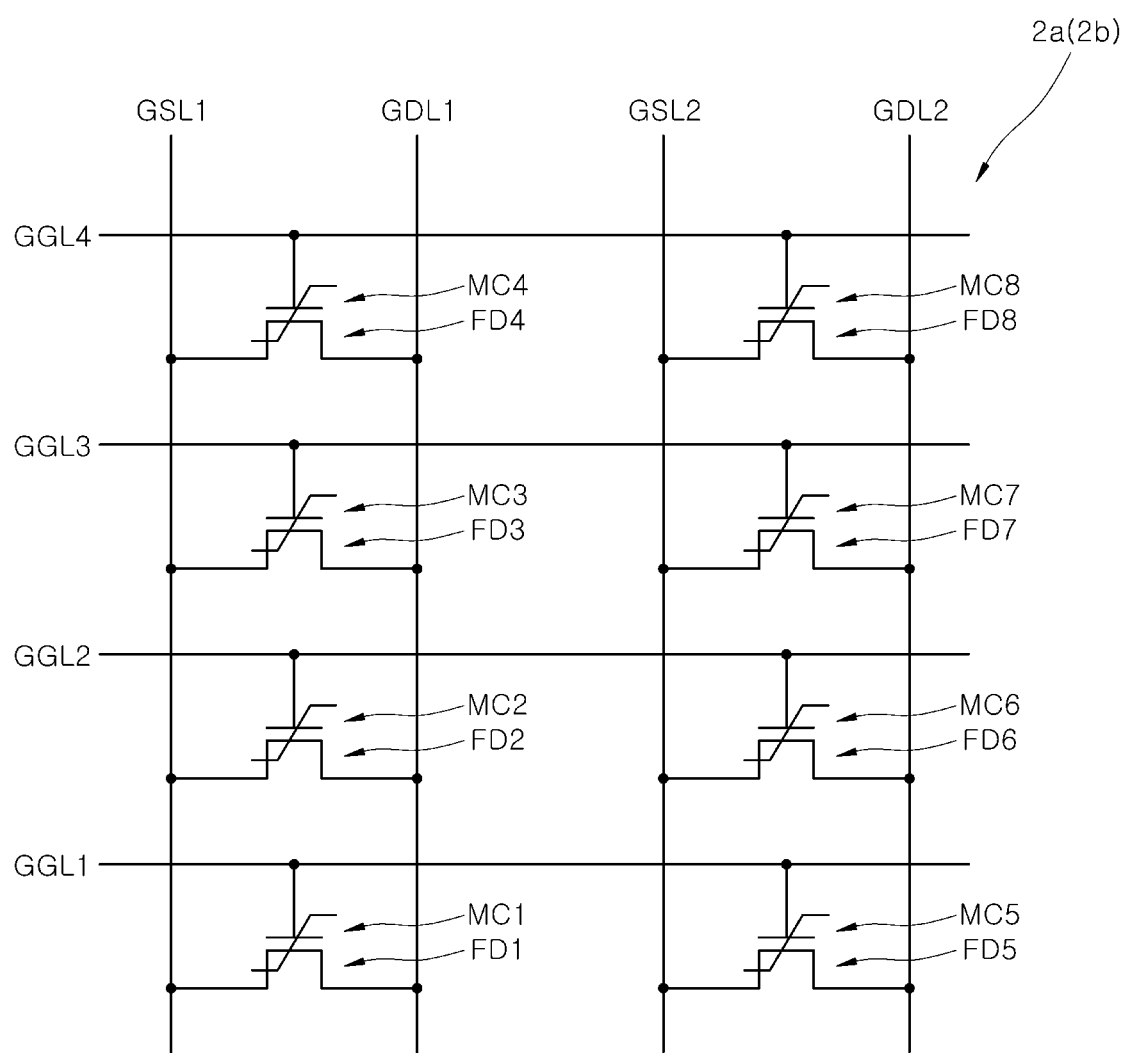
FIG. 6A is a circuit diagram schematically illustrating the nonvolatile memory device of FIG. 5.
Figure 6B:
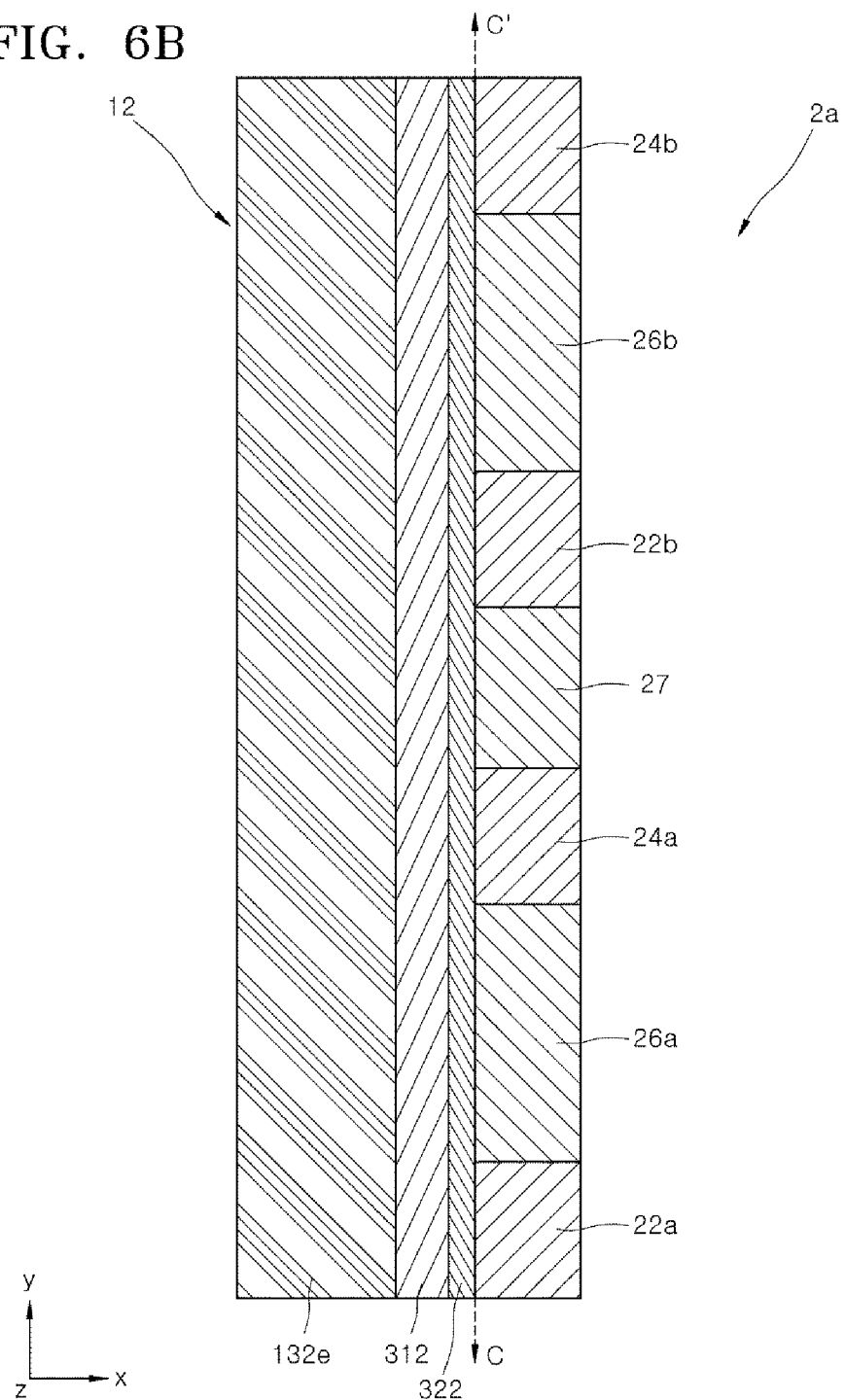
FIG. 6B is a partial plan view of the nonvolatile memory device corresponding to the circuit of FIG. 6A.

FIG. 5 is a perspective view schematically illustrating a nonvolatile memory device 2 according to another embodiment of the present disclosure. FIG. 6A is a circuit diagram schematically illustrating the nonvolatile memory device of FIG. 5. FIG. 6B is a partial plan view of the nonvolatile memory device, corresponding to the circuit diagram of FIG. 6A, and FIG. 6C is a cross-sectional view taken along a line C-C' of FIG. 6B. FIGS. 6A and 6B may be views schematically illustrating one operation unit 2a of the nonvolatile memory device 2 of FIG. 5.

Referring to FIG. 5, the nonvolatile memory device 2 may include a plurality of source electrode structures 22a and 22b, a plurality of drain electrode structures 24a and 24b, and insulation structures 26a, 26b and 27 disposed on a base insulation layer 110 along a second direction (i.e., the y-direction), as compared to the nonvolatile memory device 1 described above with reference to FIGS. 1 to 3. As an embodiment, as illustrated, a first source electrode structure 22a, a first insulation structure 26a, a first drain electrode structure 24a, an inter-element insulation structure 27, a second source electrode structure 22b, a second insulation structure 26b, and a second drain electrode structure 24b may be sequentially disposed along the second direction (i.e., the y-direction). Although the numbers of the source electrode structures, the drain electrode structures, and the insulation structures are shown as two in FIG. 5, devices contemplated by the disclosure are not necessarily limited thereto. In other embodiments, the numbers of the source electrode structures, the drain electrode structures, and the insulation structures may vary along the second direction (i.e., the y-direction).

Meanwhile, referring to FIG. 5, the first and second gate structures 12 and 14, the first and second ferroelectric layers 312 and 314, and the first and second channel layers 322 and 324 may extend along the second direction (i.e., the y-direction) on the base insulation layer 110, and cover the plurality of source electrode structures 22a and 22b, the plurality of drain electrode structures 24a and 24b, and the insulation structures 26a, 26b and 27. A first operation unit 2a illustrated in FIGS. 6B and 6C may correspond to a portion of the nonvolatile memory device 2 of FIG. 5. As an example, the first operation unit 2a may include the first gate structure 12, the first ferroelectric layer 312, the first channel layer 322, the first and second source electrode structures 22a and 22b, the first and second drain electrode structures 24a and 24b, and the insulation structures 26a, 26b and 27. Referring to FIG. 5, a second operation unit 2b may correspond to another portion of the nonvolatile memory device 2. As an example, the second operation unit 2b may include the second gate structure 14, the second ferroelectric layer 314, the second channel layer 324, the first and second source electrode structures 22a and 22b, the first and second drain electrode structures 24a and 24b, and the insulation structures 26a, 26b and 27. Hereinafter, a method of operating the nonvolatile memory device 2 will be described using the first operation unit 2a as an example, but the method may be substantially equally applied to second operation unit 2b, as well as to operation units in other embodiments.

Referring to FIGS. 5, 6A to 6C, a first global source line GSL1 and a first global drain line GDL1 of FIG. 6A may correspond to the first source electrode structure 22a and the first drain electrode structure 24a, respectively, of the first operation unit 2a illustrated in FIGS. 5, 6B and 6C. A second global source line GSL2 and a second global drain line GDL2 of FIG. 6A may correspond to the second source electrode structure 22b and the second drain electrode structure 24b, respectively, of the first operation unit 2a illustrated in FIGS. 5, 6B and 6C. A first global gate line GGL1 of FIG. 6A may correspond to the first gate electrode layer pattern 122a of the first operation unit 2a illustrated in FIGS. 5, 6B and 6C. Likewise, second to fourth global gate lines GGL2, GGL3 and GGL4 of FIG. 6A may correspond to the second to fourth gate electrode layer patterns 122b, 122c and 122d, respectively, of the first operation unit 2a illustrated in FIGS. 5, 6B and 6C.

Referring to FIG. 6A, the first to fourth memory cells MC1, MC2, MC3 and MC4 may each be connected to the first global source line GSL1 and the first global drain line GDL1. Likewise, the fifth to eighth memory cells MC5, MC6, MC7 and MC8 may each be connected to the second global source line GSL2 and the second global drain line GDL2. The first and fifth memory cells MC1 and MC5 may be connected to the first global gate line GGL1 and may have first and fifth ferroelectric layers FD1 and FD5, respectively. Likewise, the second and sixth memory cells MC2 and MC6 may be connected to the second global gate line GGL2 and may have second and sixth ferroelectric layers FD2 and FD6, respectively. The third and seventh memory cell MC3 and MC7 may be connected to a third global gate line GGL3 and may have third and seventh ferroelectric layers FD3 and FD7, respectively. The fourth and eighth memory cells MC4 and MC8 may be connected to a fourth global gate line GGL4 and may have fourth and eighth ferroelectric layers FD4 and FD8, respectively.

Hereinafter, as examples of an embodiment, a write operation and a read operation will be described for a memory cell structure including the fourth gate electrode layer pattern 122d, the first ferroelectric layer 312, and the eighth portion 322a-8 of the first channel part 322a of the first operation unit 2a shown in FIGS. 5, 6B and 6C. These structures correspond to components of the fourth memory cell MC4 of the nonvolatile memory device illustrated in FIG. 6A. Similarly, substantially same write operation and read operation may be performed with structures corresponding to the first to third and fifth to eighth memory cells MC1, MC2, MC3, MC5, MC6, MC7 and MC8.

Referring to FIG. 6C, the first channel layer 322 may include, along the second direction (i.e., the y-direction), a first channel part 322a disposed between the first source electrode structure 22a and the first drain electrode structure 24a, a second channel part 322b disposed between the second source electrode structure 22b and the second drain electrode structure 24b, and a third channel part 322c disposed between the first drain electrode structure 24a and the second source electrode structure 22b. The first to third channel parts 322a, 322b and 322c may include second portions 322a-2, 322b-2 and 322c-2 overlapping the first gate electrode layer pattern 122a; fourth portions 322a-4, 322b-4 and 322c-4 overlapping the second gate electrode layer pattern 122b; sixth portions 322a-6, 322b-6 and 322c-6 overlapping the third gate electrode layer pattern 122c; and eighth portions 322a-8, 322b-8 and 322c-8 overlapping the fourth gate electrode layer pattern 122d. Similarly, the first to third channel parts 322a, 322b and 322c may include first portions 322a-1, 322b-1 and 322c-1 overlapping the first gate insulation layer pattern 132a; third portions 322a-3, 322b-3 and 322c-3 overlapping the second gate insulation layer pattern 132b; fifth portions 322a-5, 322b-5 and 322c-5 overlapping the third gate insulation layer pattern 132c; and seventh portions 322a-7, 322b-7 and 322c-7 overlapping the fourth gate insulation layer pattern 132d; and ninth portions 322a-9, 322b-9 and 322c-9 overlapping the fifth gate insulation layer pattern 132e.

Meanwhile, in relation to a write operation for the fourth memory cell MC4 in FIG. 6A, the fourth global word line GGL4 is selected from the first to fourth global word lines GGL1, GGL2, GGL3 and GGL4. A polarization switching voltage Vs having a magnitude equal to or greater than a predetermined threshold voltage may be applied to the fourth global word line GGL4, and the polarization switching voltage Vs may be applied to gate electrodes of the fourth memory cell MC4 and the eighth memory cell MC8. The polarization switching voltage Vs is a voltage capable of switching the polarization of the fourth ferroelectric layer FD4 of the fourth memory cell MC4 and the eighth ferroelectric layer FD8 of the eighth memory cell MC8. However, in order to perform the write operation only on the fourth memory cell MC4, the first global source line GSL1 and the first global drain line GDL1 may be grounded, and a predetermined voltage Vp having an absolute value smaller than an absolute value of the polarization switching voltage Vs may be separately applied to the second global source line GSL2 and the second global drain line GDL2. In this manner, the polarization switching voltage Vs is only applied to the fourth ferroelectric layer FD4 of the fourth memory cell MC4, and a voltage corresponding to a difference between the polarization switching voltage Vs and the predetermined voltage Vp may be applied to the eighth ferroelectric layer FD8 of the eighth memory cell MC8. Accordingly, when the polarization switching voltage Vs is applied to the global gate line GGL4, the polarization of the fourth ferroelectric layer FD4 of the fourth memory cell MC4 is switched, and the polarization of the eighth ferroelectric layer FD8 of the eighth memory cell MC8 is not switched.

The write operation for storing the switched polarization in the form of remanent polarization in the fourth ferroelectric layer FD4 is substantially the same as the write operation of the first ferroelectric layer 312 described above with reference to FIGS. 4A to 4D and will not be repeated here, however through such a similar method, the write operation may be performed on the fourth memory cell MC4.

The above-described write operation for the fourth memory cell MC4 can also be explained using the corresponding structures 2 and 2a shown in FIGS. 5 and 6B. First, a polarization switching voltage Vs is applied to the fourth gate electrode layer pattern 122d corresponding to the fourth global word line GGL4. At this time, the first source electrode structure 22a and the first drain electrode structure 24a respectively corresponding to the first global source line GSL1 and the first global drain line GDL1 may be grounded. On the other hand, a predetermined voltage Vp having a magnitude smaller than the polarization switching voltage Vs may be applied to the second source electrode structure 22b and the second drain electrode structure 24b respectively corresponding to the second global source line GSL2 and the second global drain line GDL2. By doing so, polarization within a first region of the first ferroelectric layer 312, positioned between the first source electrode structure 22a and the first drain electrode structure 24a along the second direction, and in contact with the fourth gate electrode layer pattern 122d, may be switched. Meanwhile, a voltage substantially smaller than the polarization switching voltage Vs is applied to a second region of the first ferroelectric layer 312, positioned between the second source electrode structure 22b and the second drain electrode structure 24b along the second direction while in contact with the fourth gate electrode layer pattern 122d. Consequently, the polarization in this second region of the first ferroelectric layer 312 is not switched.

After the polarization switching voltage Vs is removed, the switched polarization may be stored in the form of remanent polarization. The first region of the first ferroelectric layer 312 with the switched polarization may be a region overlapping the eighth portion 322a-8 of the first channel part 322a of FIG. 6C. The second region of the first ferroelectric layer 312 without a switched polarization may be a region overlapping the eighth portion 322b-8 of the second channel part 322b of FIG. 6C.

Meanwhile, a read operation for remanent polarization stored in the fourth memory cell MC4 will be explained. First, in FIG. 6A, the fourth global word line GGL4 is selected. Subsequently, a read voltage Vr equal to or greater than a predetermined threshold voltage may be applied to the gate electrodes of the fourth memory cell MC4 and the eighth memory cell MC8 through the fourth global word line GGL4. An absolute value of the read voltage Vr may be smaller than an absolute value of the polarization switching voltage Vs. That is, polarization inside the fourth ferroelectric layer FD4 and the eighth ferroelectric layer FD8 may not be switched by the read voltage Vr. Transistors of the fourth memory cell MC4 and the eighth memory cell MC8 are turned on by the read voltage Vr, and conductive channels may be formed in the channel layers of the transistors. When a source-drain potential difference is formed between the first global source line GSL1 and the first global drain line GDL1, a source-drain current may flow only through the conductive channel of the fourth memory cell MC4. The signal information of the remanent polarization stored in the fourth memory cell MC4 can be read by measuring the magnitude of the source-drain current because the magnitude of the source-drain current changes according to the orientation of the remanent polarization stored in the fourth ferroelectric layer FD4 of the fourth memory cell MC4. On the other hand, when a potential difference is not formed between the second global source line GSL2 and the second global drain line GDL2, the operation current may not flow through the conductive channel of the eighth memory cell MC8.

The above-described read operation for the fourth memory cell MC4 may also be explained in the same manner referring to FIGS. 5, 6B and 6C. First, the read voltage Vr is applied to the fourth gate electrode layer pattern 122d corresponding to the fourth global word line GGL4. A conductive channel CH100 may be formed in the channel layer 322 overlapping the fourth gate electrode layer pattern 122d by the read voltage Vr. Subsequently, a source-drain voltage is applied between the first source electrode structure 22a and the first drain electrode structure 24a respectively corresponding to the first global source line GSL1 and the first global drain line GDL1 to form a potential difference. The potential difference is not formed between the second global source line GSL2 and the second global drain line GDL2. As a result, a source-drain current may flow only through the conductive channel CH100 between the first source electrode structure 22a and the first drain electrode structure 24a. The read operation for the fourth memory cell MC4 may be performed by measuring the source-drain current.

Through the above-described methods, it is possible to perform a write operation and a read operation through random access to the memory cells of the first operation unit 2a of the nonvolatile memory device 2 of FIGS. 5, 6B and 6C. The write operation and the read operation for the first operation unit 2a of the nonvolatile memory device 2 of FIGS. 5, 6B and 6C may be equally applied to the second operation unit 2b of the nonvolatile memory device 2.

Figure 7:
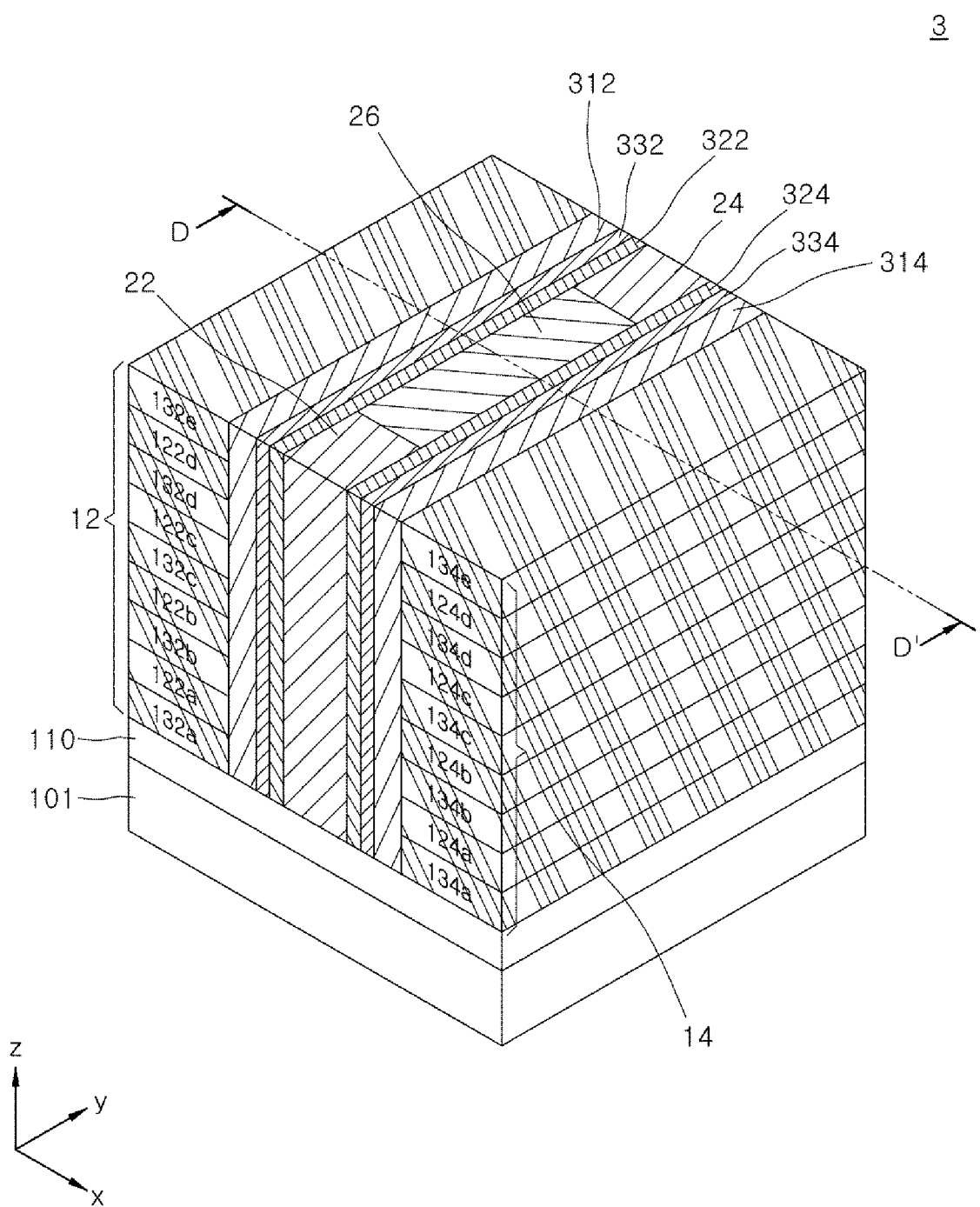
FIG. 7 is a perspective view schematically illustrating a nonvolatile memory device according to another embodiment of the present disclosure.
Figure 8:
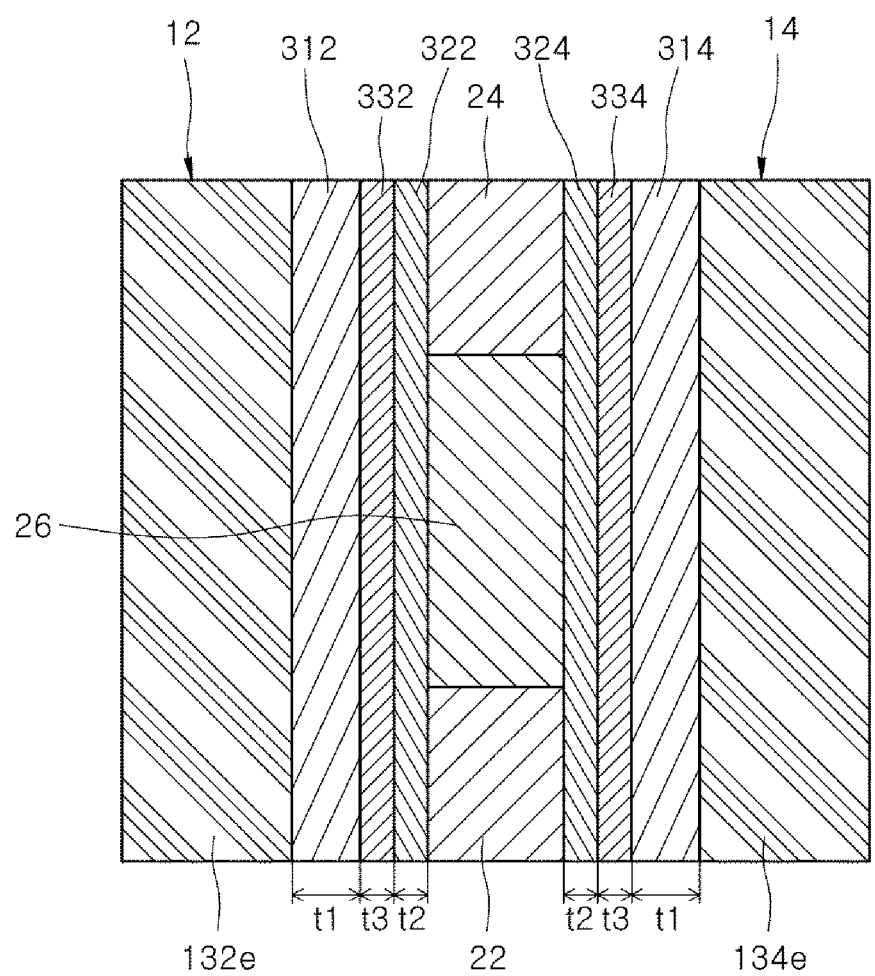
FIG. 8 is a plan view of the nonvolatile memory device of FIG. 7.
Figure 9:
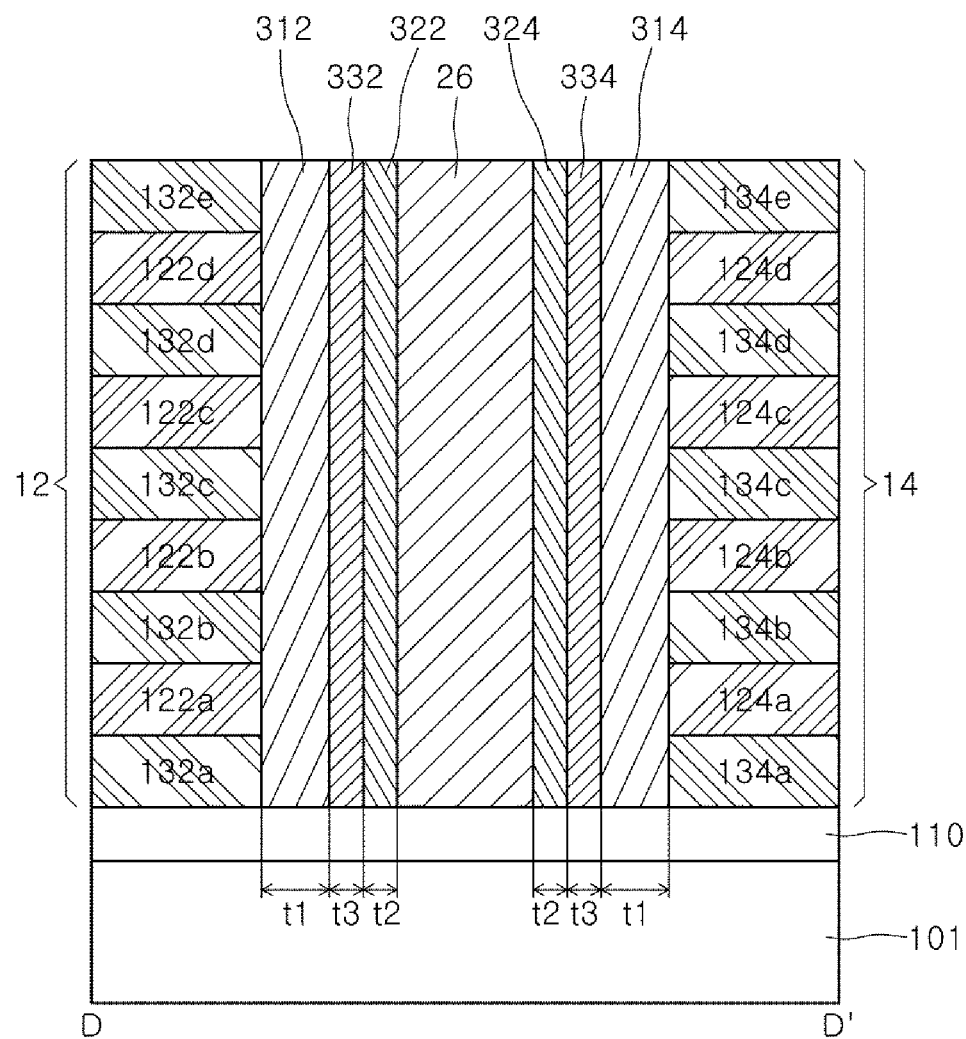
FIG. 9 is a cross-sectional view taken along a line D-D' of the nonvolatile memory device of FIG. 7.

FIG. 7 is a perspective view schematically illustrating a nonvolatile memory device 3 according to another embodiment of the present disclosure. FIG. 8 is a plan view of the nonvolatile memory device of FIG. 7. FIG. 9 is a cross-sectional view taken along a line D-D' of the nonvolatile memory device of FIG. 7.

Referring to FIGS. 7 to 9, a nonvolatile memory device 3 may further include first and second interfacial insulation layers 332 and 334, as compared to the nonvolatile memory device 1 of FIGS. 1 to 3.

The first interfacial insulation layer 332 may be disposed between a first ferroelectric layer 312 and a first channel layer 322. One surface of the first interfacial insulation layer 322 may contact a first ferroelectric layer 312 and another surface of the first interfacial insulation layer 332 may contact the first channel layer 322. In an embodiment, the first interfacial insulation layer 332 may be disposed on a plane formed substantially parallel to the first and second directions (i.e., a y-z plane parallel to the z-direction and y-direction). The first interfacial insulation layer 332 may have a predetermined thickness t3 along a third direction (i.e., the x-direction). In an embodiment, the thickness t3 of the first interfacial insulation layer 332 may be smaller than the thickness t1 of the first ferroelectric layer 312.

The first interfacial insulation layer 332 can prevent the first ferroelectric layer from directly contacting the first channel layer 322. That is, the first interfacial insulation layer 332 can prevent defect sites such as oxygen vacancies from being generated at an interface between the first ferroelectric layer 312 and the first channel layer 322. The first interfacial insulation layer 332 may have an amorphous structure. The first interfacial insulation layer 332 may have a lower dielectric constant than the first ferroelectric layer 312. The first interfacial insulation layer 332 may be non-ferroelectric. The first interfacial insulation layer 332 may, for example, include silicon oxide, silicon nitride, silicon oxynitride, aluminum oxide, and the like.

The second interfacial insulation layer 334 may be disposed between a second ferroelectric layer 314 and a second channel layer 324. One surface of the second interfacial insulation layer 334 may contact the second ferroelectric layer 314 and another surface of the second interfacial insulation layer 334 may contact the second channel layer 324. The second interfacial insulation layer 334 can prevent the second ferroelectric layer 314 from directly contacting the second channel layer 324.

The second interfacial insulation layer 334 may have substantially the same configuration as the first interfacial insulation layer 332. The second interfacial insulation layer 334 may have a predetermined thickness t3 along a third direction (i.e., the x-direction).

Figure 10:
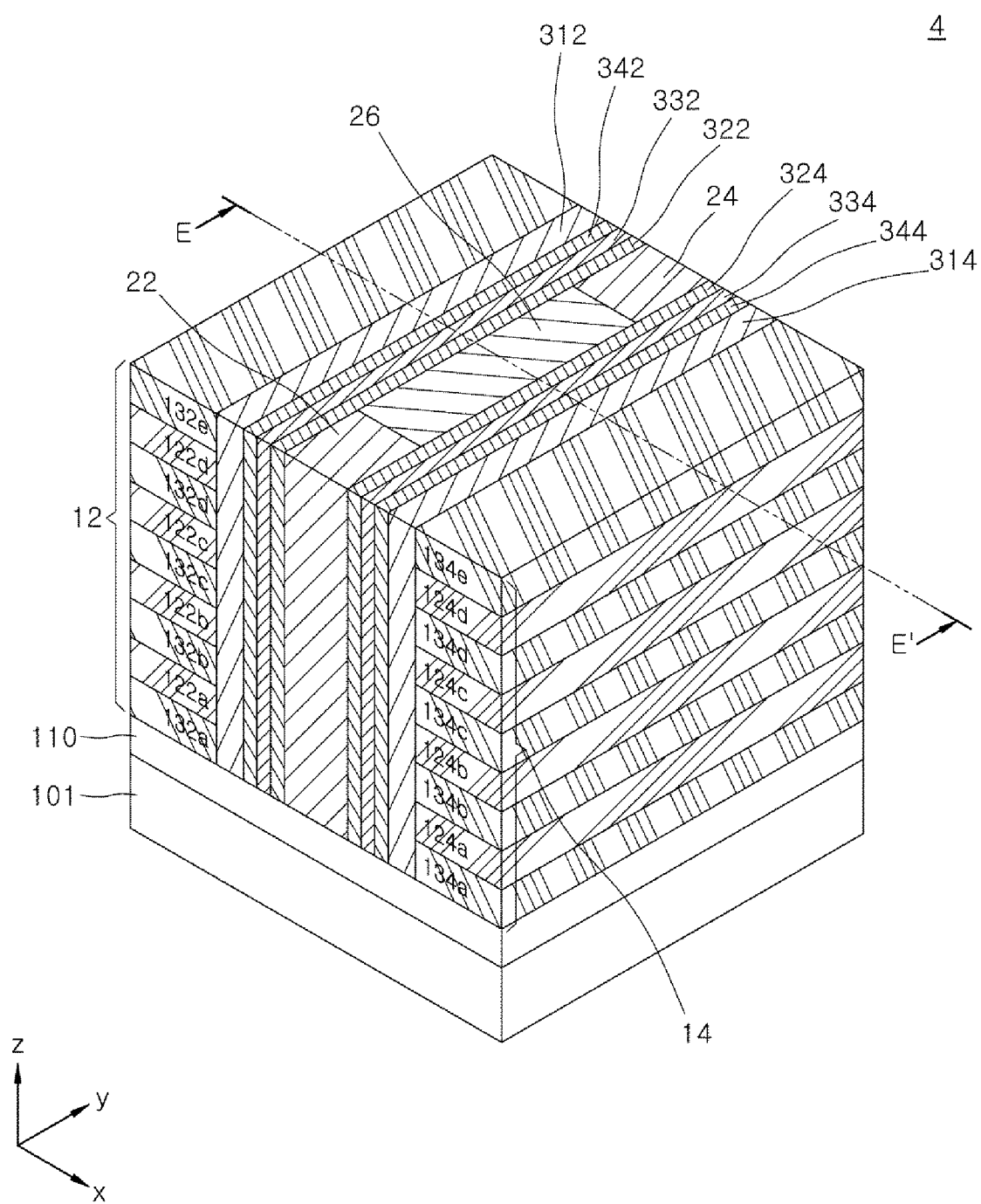
FIG. 10 is a perspective view schematically illustrating a nonvolatile memory device according to yet another embodiment of the present disclosure.
Figure 11:
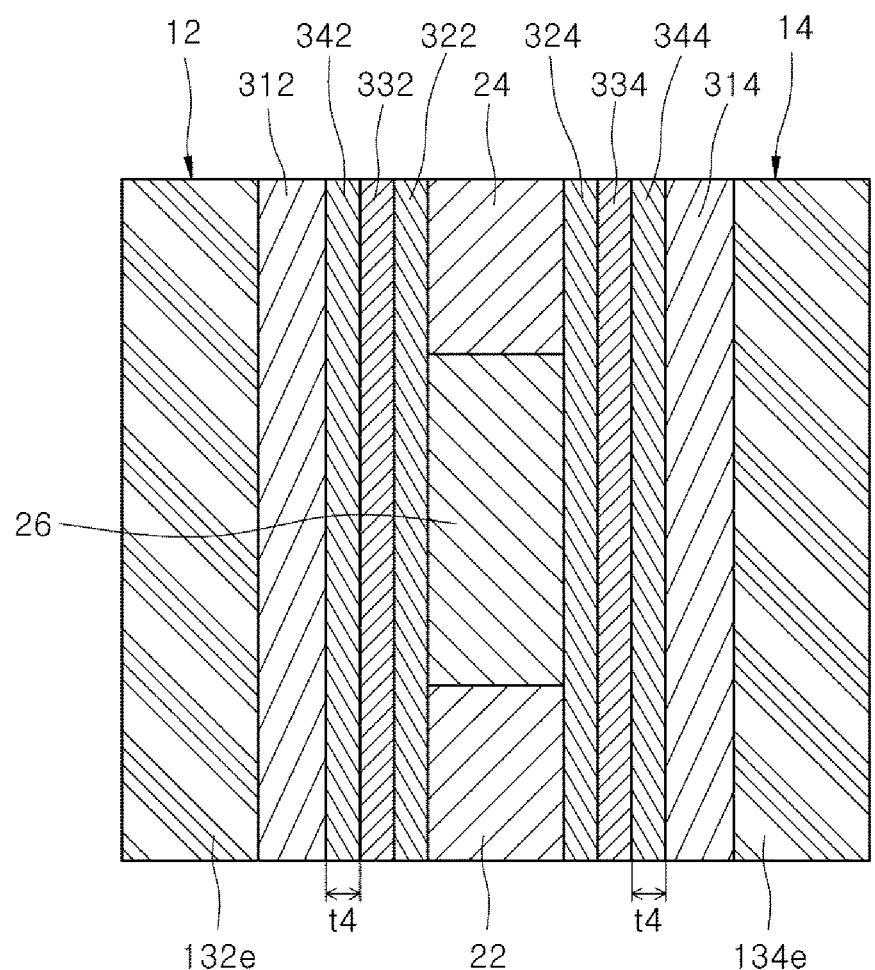
FIG. 11 is a plan view of the nonvolatile memory device of FIG. 10.
Figure 12:
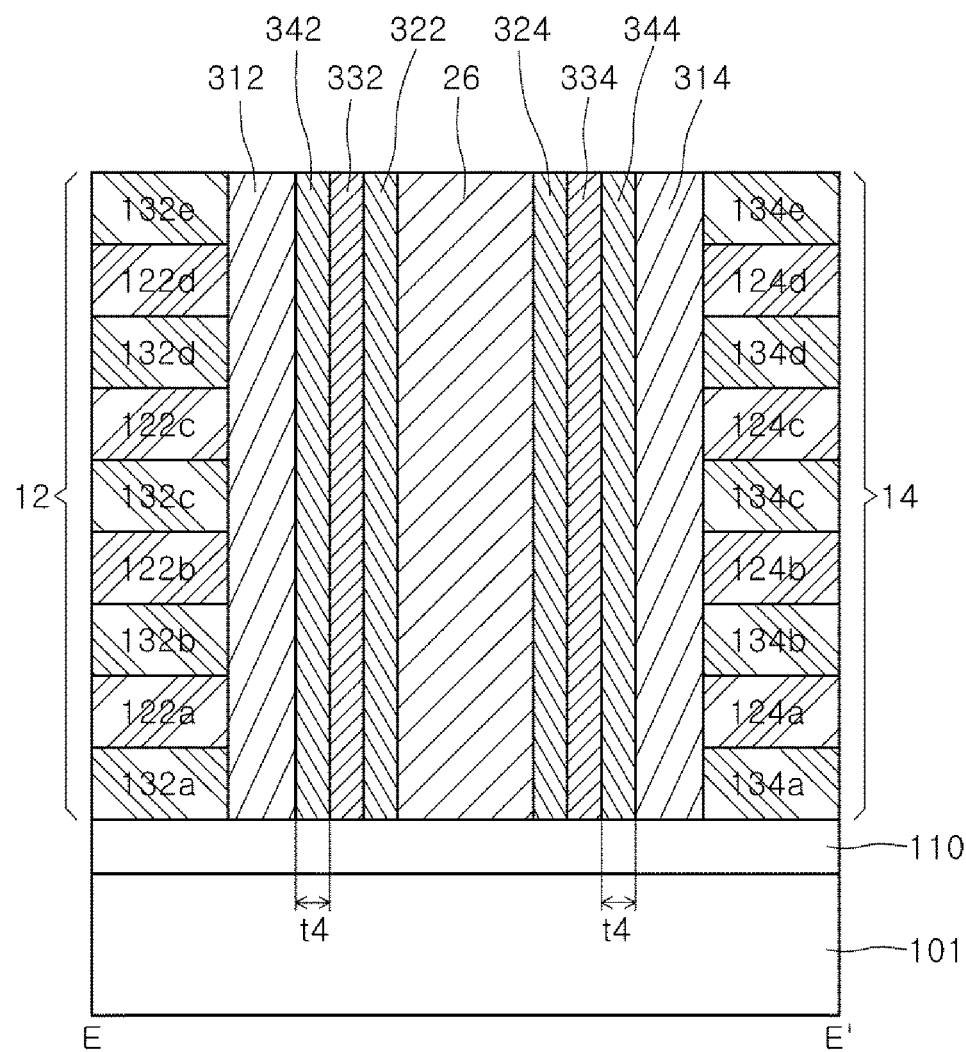
FIG. 12 is a cross-sectional view taken along a line E-E' of the nonvolatile memory device of FIG. 10.

FIG. 10 is a perspective view schematically illustrating a nonvolatile memory device 4 according to yet another embodiment of the present disclosure. FIG. 11 is a plan view of the nonvolatile memory device of FIG. 10. FIG. 12 is a cross-sectional view taken along the line E-E' of the nonvolatile memory device of FIG. 10.

Referring to FIGS. 10 to 12, the nonvolatile memory device 4 may further include first and second floating electrode layers 342 and 344, as compared to the nonvolatile memory device 3 of FIGS. 7 to 9. The first and second floating electrode layers 342 and 344 may be formed of a conductive material.

The first floating electrode layer 342 may be disposed between a ferroelectric layer 312 and a first interfacial insulation layer 332. One surface of the first floating electrode layer 342 may contact the first ferroelectric layer 312 and another surface of the first floating electrode layer 342 may contact the first interfacial insulation layer 332. In an embodiment, the first floating electrode layer 342 may be disposed on a plane defined by first and second directions (i.e., the z-direction and y-direction). The first floating electrode layer 342 may have a predetermined thickness t4 along a third direction (i.e., the x-direction).

The first floating electrode layer 342 may maintain an electrical floating state. As an example, the first floating electrode layer 342 is not electrically connected to first to fourth gate electrode layer patterns 122a, 122b, 122c and 122d and a first channel layer 322 of a first gate structure 12. The first floating electrode layer 342 may charge positive charges or negative charges therein according to the polarity of the voltage applied to the first to fourth gate electrode layer patterns 122a, 122b, 122c and 122d. The charged positive charges or negative charges may function to stabilize the remanent polarization stored in the first ferroelectric layer 312. Thus, the presence of the floating electrode layer improves the endurance and stability of the remanent polarization of the nonvolatile memory device 4.

In addition, in an embodiment, a structure of a nonvolatile memory device includes the first ferroelectric layer 312, having a relatively high dielectric constant, which is electrically connected in series to the first interfacial insulation layer 332 having a relatively low dielectric constant. When the polarization switching voltage or the read voltage is applied to the series connection structure, if the first floating electrode layer 342 is not present, a relatively high voltage may be applied to the first interfacial insulation layer 332 having a relatively low dielectric constant. Due to the thinness of the first ferroelectric layer 312 and the first interfacial insulation layer 332, the first interfacial insulation layer 332 may be in effect electrically destroyed. Conversely, when the first floating electrode layer 342 is interposed between the first ferroelectric layer 312 and the first interfacial insulation layer 332, the first floating electrode layer 342 can suppress the application of a relatively high voltage to the first interfacial insulation layer 332 thereby improving the endurance and reliability of the nonvolatile memory device 4.

Likewise, the second floating electrode layer 344 may be disposed between the second ferroelectric layer 314 and the second interfacial insulation layer 334. As an example, the second floating electrode layer 344 is not electrically connected to the first to fourth gate electrode layer patterns 124a, 124b, 124c and 124d of the second gate structure 14 and the second channel layer 324. One surface of the second floating electrode layer 344 may contact the second ferroelectric layer 314 and another surface of the second floating electrode layer 344 may contact the second interfacial insulation layer 334. In an embodiment, the second floating electrode layer 344 may be disposed on a plane formed substantially parallel to the first and second directions (i.e., a y-z plane parallel to the z-direction and y-direction). The second floating electrode layer 344 may have a predetermined thickness t4 along the third direction (i.e., the x-direction). The configuration and function of the second floating electrode layer 344 may be substantially the same as the configuration and function of the first floating electrode layer 342. That is, the second floating electrode layer 344 can improve the retention of the remanent polarization stored in the second ferroelectric layer 314 and the endurance of the second interfacial insulation layer 334.

Figure 13:
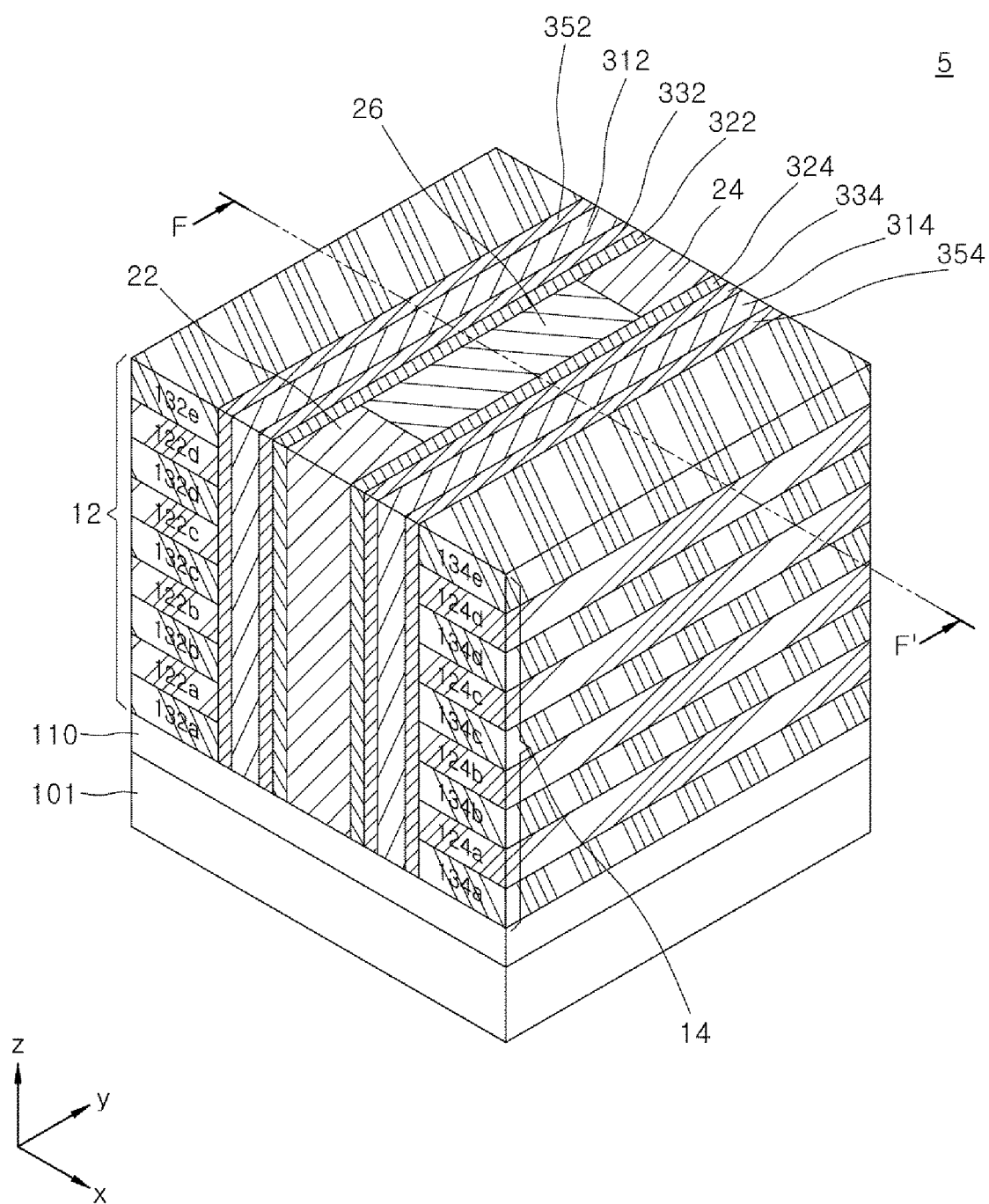
FIG. 13 is a perspective view schematically illustrating a nonvolatile memory device according to still yet another embodiment of the present disclosure.
Figure 14:
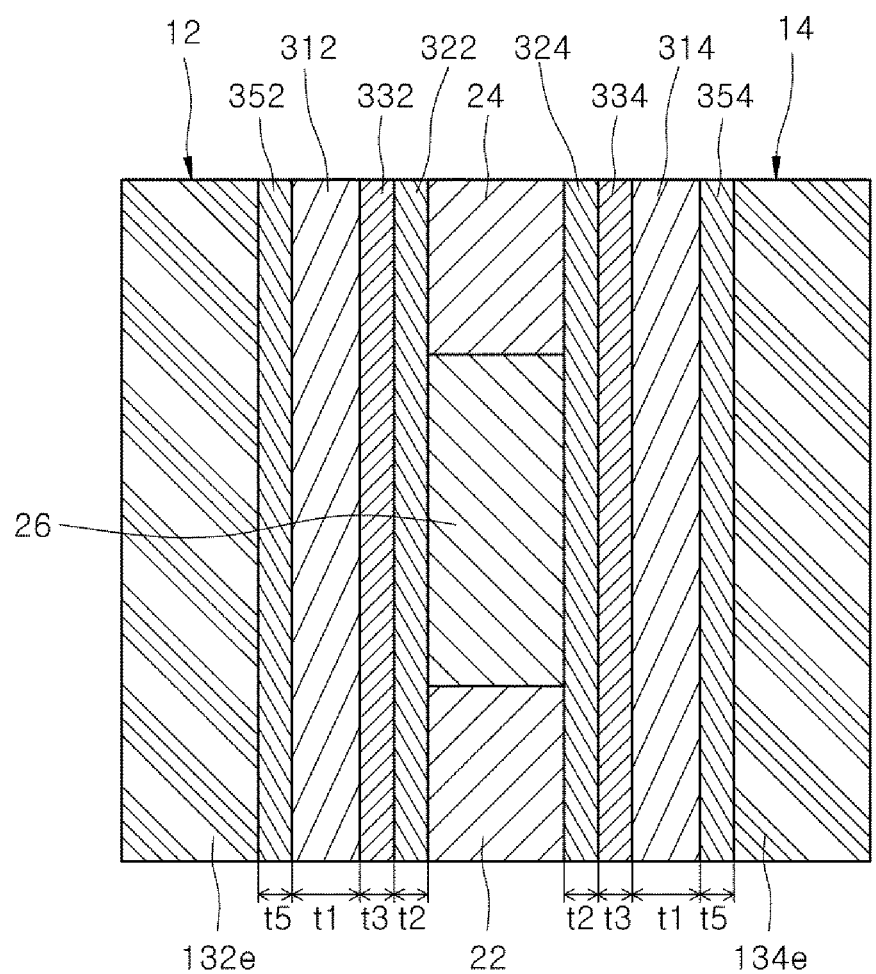
FIG. 14 is a plan view of the nonvolatile memory device of FIG. 13.
Figure 15:
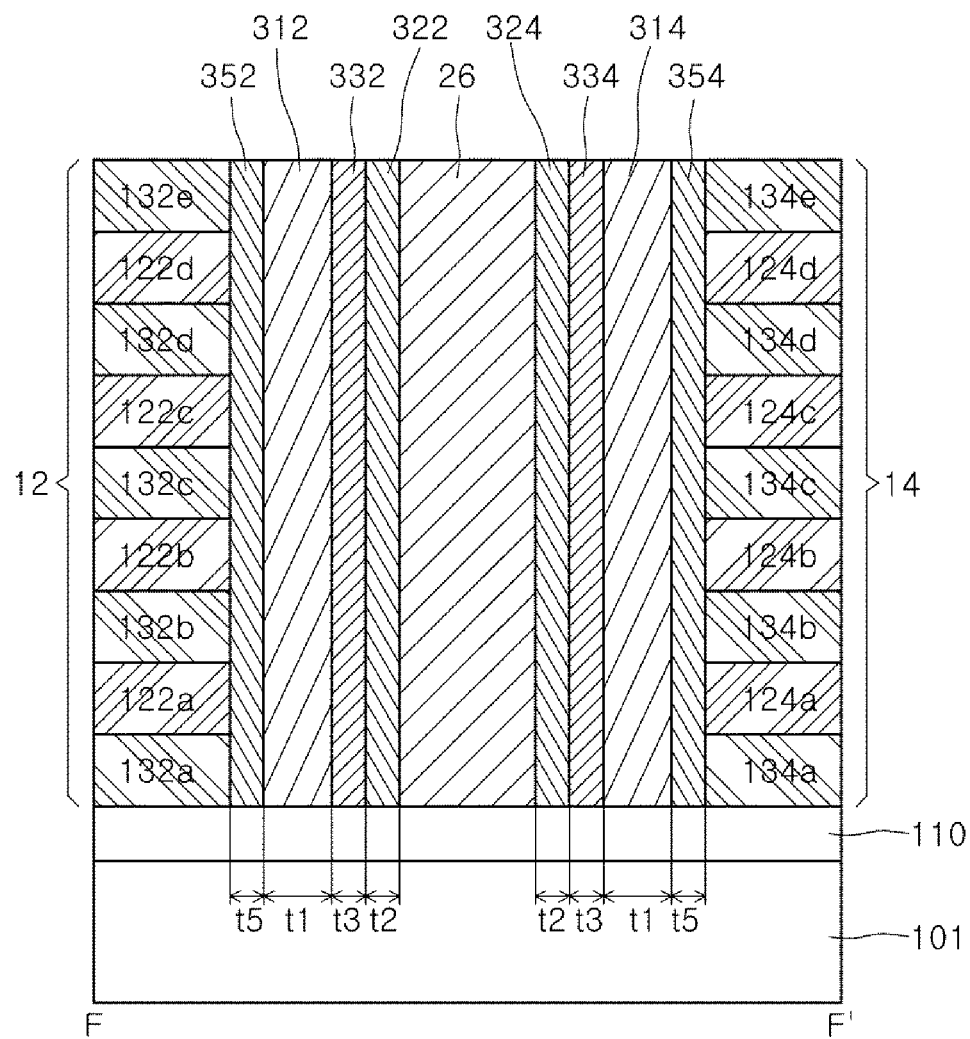
FIG. 15 is a cross-sectional view taken along a line F-F' of the nonvolatile memory device of FIG. 13.

FIG. 13 is a perspective view schematically illustrating a nonvolatile memory device 5 according to still yet another embodiment of the present disclosure. FIG. 14 is a plan view of the nonvolatile memory device of FIG. 13. FIG. 15 is a cross-sectional view taken along a line F-F' of the nonvolatile memory device of FIG. 13.

Referring to FIGS. 13 to 15, the nonvolatile memory device 5 may further include third and fourth interfacial insulation layers 352 and 354, as compared to the nonvolatile memory device 3 of FIGS. 7 to 9.

The third interfacial insulation layer 352 may be disposed between a first gate structure 12 and a first ferroelectric layer 312. As an example, one surface of the third interfacial insulation layer 352 may contact the first gate structure 12 and another surface of the third interfacial insulation layer 352 may contact the first ferroelectric layer 312. In an embodiment, the third interfacial insulation layer 352 may be disposed on a plane formed substantially parallel to the first and second directions (i.e., a y-z plane parallel to the z-direction and y-direction). The third interfacial insulation layer 352 may have a predetermined thickness t5 along the third direction (i.e., the x-direction). In an embodiment, the thickness t5 of the third interfacial insulation layer 352 may be smaller than the thickness t1 of the first ferroelectric layer 312.

The third interfacial insulation layer 352 can prevent the first ferroelectric layer 312 from directly contacting the first gate structure 12. The third interfacial insulation layer 352 can prevent defect sites from being generated at interfaces between the first ferroelectric layer 312 and the first to fourth gate electrode layer patterns 122a, 122b, 122c and 122d of the first gate structure 12. The third interfacial insulation layer 352 may have an amorphous structure. The third interfacial insulation layer 352 may have a lower dielectric constant than the first ferroelectric layer 312. The third interfacial insulation layer 352 may be non-ferroelectric. As an example, the third interfacial insulation layer 352 may have a paraelectric property. The third interfacial insulation layer 352 may, for example, include silicon oxide, silicon nitride, silicon oxynitride, aluminum oxide, and the like.

The third interfacial insulation layer 352 may be formed of substantially the same material as the first interfacial insulation layer 332. The thickness t5 of the third interfacial insulation layer 352 may be substantially the same as the thickness t3 of the first interfacial insulation layer 332.

Likewise, the fourth interfacial insulation layer 354 may be disposed between the second gate structure 14 and the second ferroelectric layer 314. As an example, one surface of the fourth interfacial insulation layer 354 may contact the second gate structure 14 and another surface of the fourth interfacial insulation layer 354 may contact the second ferroelectric layer 314. In an embodiment, the fourth interfacial insulation layer 354 may be disposed on a plane formed substantially parallel to the first and second directions (i.e., a y-z plane parallel to the z-direction and y-direction). The fourth interfacial insulation layer 354 may have a thickness t5 along the third direction (i.e., the x-direction). In an embodiment, the thickness t5 of the fourth interfacial insulation layer 354 may be smaller than the thickness t1 of the second ferroelectric layer 314.

The fourth interfacial insulation layer 354 can prevent the second ferroelectric layer 314 from directly contacting the second gate structure 14. The fourth interfacial insulation layer 354 can prevent defect sites from being generated at interfaces between the second ferroelectric layer 314 and the first to fourth gate electrode patterns 124a, 124b, 124c and 124d of the second gate structure 14. The fourth interfacial insulation layer 354 may have an amorphous structure. The fourth interfacial insulation layer 354 may have a lower dielectric constant than the second ferroelectric layer 314. The fourth interfacial insulation layer 354 may be non-ferroelectric. As an example, the fourth interfacial insulation layer 354 may have a paraelectric property. The fourth interfacial insulation layer 354 may, for example, include silicon oxide, silicon nitride, silicon oxynitride, aluminum oxide, and the like.

The fourth interfacial insulation layer 354 may be formed of substantially the same material as the second interfacial insulation layer 334. The thickness t5 of the fourth interfacial insulation layer 354 may be substantially the same as the thickness t3 of the second interfacial insulation layer 334.

Figure 16:
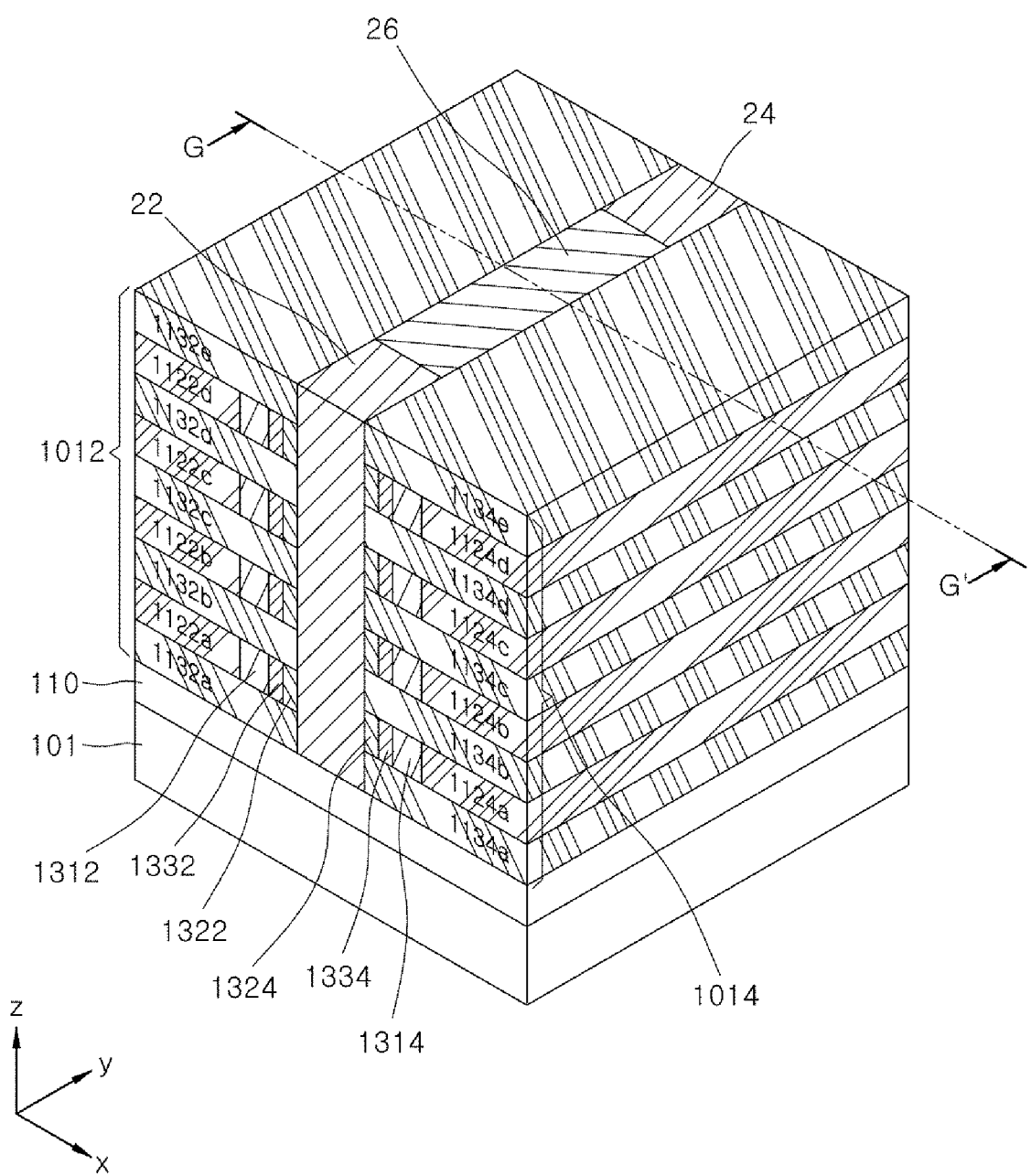
FIG. 16 is a perspective view schematically illustrating a nonvolatile memory device according to still yet another embodiment of the present disclosure.
Figure 17:
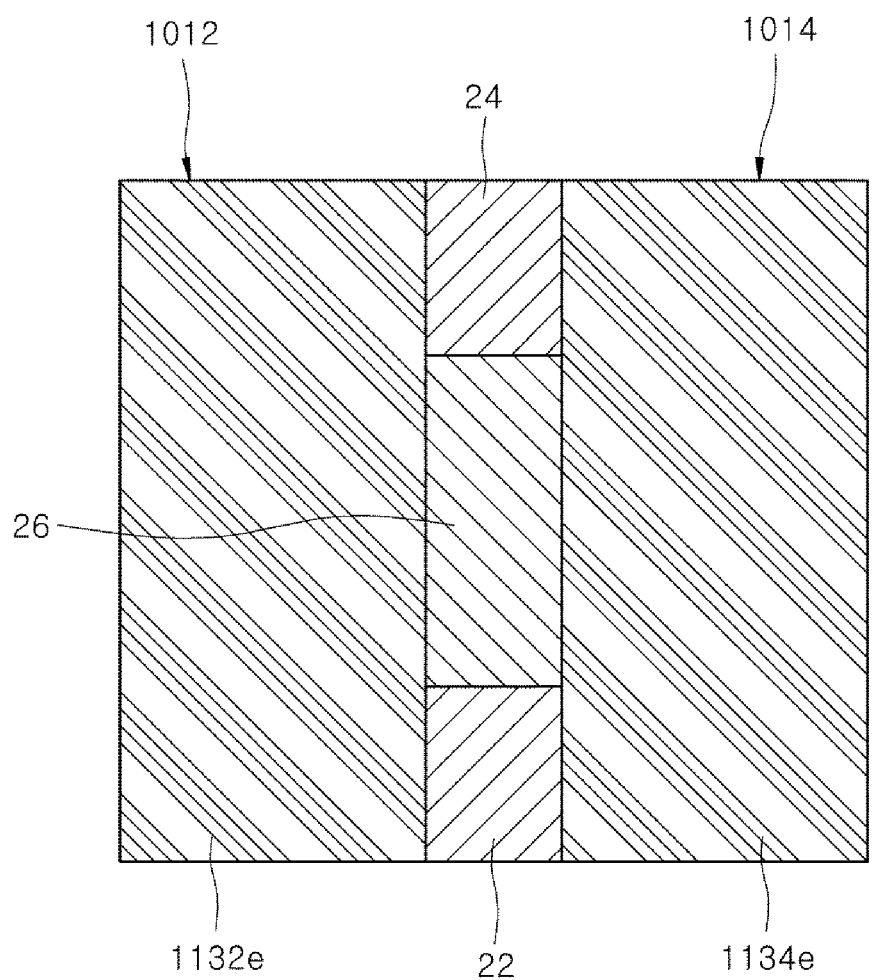
FIG. 17 is a plan view of the nonvolatile memory device of FIG. 16.
Figure 18:
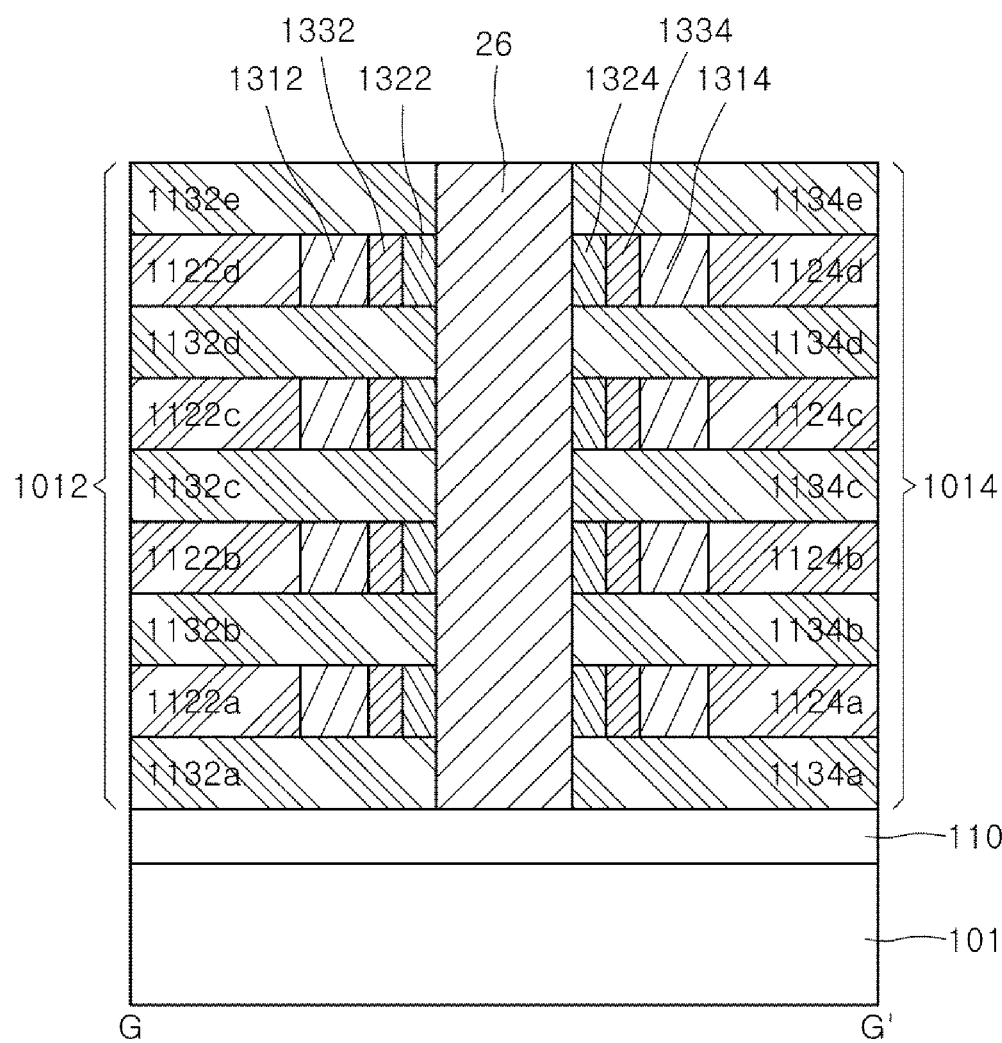
FIG. 18 is a cross-sectional view taken along a line G-G' of the nonvolatile memory device of FIG. 16.

FIG. 16 is a perspective view schematically illustrating a nonvolatile memory device 6 according to still yet another embodiment of the present disclosure. FIG. 17 is a plan view of the nonvolatile memory device of FIG. 16. FIG. 18 is a cross-sectional view taken along a line G-G' of the nonvolatile memory device of FIG. 16.

Referring to FIGS. 16 to 18, the nonvolatile memory device 6 may be differentiated, as compared to the nonvolatile memory device 3 of FIGS. 7 to 9, by configurations of first and second gate structures 1012 and 1014.

In this embodiment, the first gate structure 1012 may include first to fourth gate electrode layer patterns 1122a, 1122b, 1122c and 1122d and first to fifth gate insulation layer patterns 1132a, 1132b, 1132c, 1132d and 1132e, which are alternately stacked along a first direction (i.e., the z-direction). The second gate structure 1014 may include first to fourth gate electrode layer patterns 1124a, 1124b, 1124c and 1124d and first to fifth gate insulation layer patterns 1134a, 1134b, 1134c, 1134d and 1134e, which are alternately stacked along the first direction (i.e., the z-direction).

Referring to FIGS. 16 and 18, the first to fifth gate insulation layer patterns 1132a, 1132b, 1132c, 1132d and 1132e of the first gate structure 1012 may separate a first ferroelectric layer 1312, a first interfacial insulation layer 1332 and a first channel layer 1322 with respect to the second and third direction (i.e., the y-direction and x-direction). Accordingly, the first ferroelectric layer 1312, the first interfacial insulation layer 1332 and the first channel layer 1322 may be discontinuously disposed in the first direction. In comparison with an embodiment described above with reference to FIGS. 7 to 9, the first ferroelectric layer 1312 of this embodiment may be disposed to contact portions of one sidewall surface of the first gate structure 1012, that is, only sidewall surfaces of the first to fourth gate electrode layer patterns 1122a, 1122b, 1122c and 1122d, in a lateral direction (i.e., the x-direction). In other words, the first ferroelectric layer 1312 does not contact the first to fifth gate insulation layer patterns 1132a, 1132b, 1132c, 1132d and 1132e in the lateral direction (i.e., the x-direction). In addition, the first interfacial insulating layer 1332 and the first channel layer 1322 may be sequentially arranged in a lateral direction from the first ferroelectric layer 1312, and between the first to fifth gate insulation layer patterns 1132a, 1132b, 1132c, 1132d and 1132e.

Referring to FIGS. 16 and 18, in comparison with the first to fifth gate insulation layer patterns 132a, 132b, 132c, 132d and 132e of an embodiment described above with reference to FIGS. 7 to 9, the first to fifth gate insulation layer patterns 1132a, 1132b, 1132c, 1132d and 1132e may be disposed to directly contact a source electrode structure 22, a drain electrode structure 24 and an insulation structure 26. In this embodiment, the first to fifth gate insulation layer patterns 1132a, 1132b, 1132c, 1132d and 1132e can more effectively implement electrical insulation between the first to fourth gate electrode layer patterns 1122a, 1122b, 1122c and 1122d in the first direction (i.e., the z-direction).

Likewise, referring to FIGS. 16 and 18, the first to fifth gate insulation layer patterns 1134a, 1134b, 1134c, 1134d and 1134e of the second gate structure 1014 can separate a second ferroelectric layer 1314, a second interfacial insulation layer 1334, and a second channel layer 1324 from each other with respect to the second and third direction (i.e., the y-direction and x-direction). Accordingly, the second ferroelectric layer 1314, the second interfacial insulation layer 1334, and the second channel layer 1324 may be discontinuously disposed in the first direction (i.e., the z-direction). Accordingly, in comparison with an embodiment described above with reference to FIGS. 7 to 9, the second ferroelectric layer 1314 of this embodiment may be disposed to contact portions of one sidewall surface of the second gate structure 1014, that is, only sidewall surfaces of the first to fourth gate electrode layer patterns 1124a, 1124b, 1124c and 1124d, in a lateral direction (i.e., the x-direction). In other words, the second ferroelectric layer 1314 does not contact the first to fifth gate insulation layer patterns 1134a, 1134b, 1134c, 1134d and 1134e in the lateral direction (i.e., the x-direction).

Referring to FIGS. 16 and 18, in comparison with the first to fifth gate insulation layer patterns 134a, 134b, 134c, 134d and 134e of an embodiment described above with reference to FIGS. 7 to 9, the first to fifth gate insulation layer patterns 1134a, 1134b, 1134c, 1134d and 1134e may be disposed to directly contact the source electrode structure 22, the drain electrode structure 24 and the insulation structure 26. In this embodiment, the first to fifth gate insulation layer patterns 1134a, 1134b, 1134c, 1134d and 1134e can more effectively implement electrical insulation between the first to fourth gate electrode layer patterns 1124a, 1124b, 1124c and 1124d in the first direction (i.e., the z-direction).

Meanwhile, the material properties and functions of the first to fourth gate electrode layer patterns 1122a, 1122b, 1122c, 1122d, 1124a, 1124b, 1124c and 1124d of the first and second gate structures 1012 and 1014, the first and second ferroelectric layers 1312 and 1314, the first and second interfacial insulation layers 1332 and 1334, the first and second channel layers 1322 and 1324, and the first to fifth gate insulation layer patterns 1132a, 1132b, 1132c, 1132d, 1132e, 1134a, 1134b, 1134c, 1134d and 1134e are substantially the same as the material properties and functions of the first to fourth gate electrode layer patterns 122a, 122b, 122c, 122d, 124a, 124b, 124c and 124d of the first and second gate structures 12 and 14, the first and second ferroelectric layers 312 and 314, the first and second interfacial insulation layers 332 and 334, the first and second channel layers 322 and 324, and the first to fifth gate insulation layer patterns 132a, 132b, 132c, 132d, 1132e, 134a, 134b, 1134c, 134d and 134e, respectively.

Figure 19:
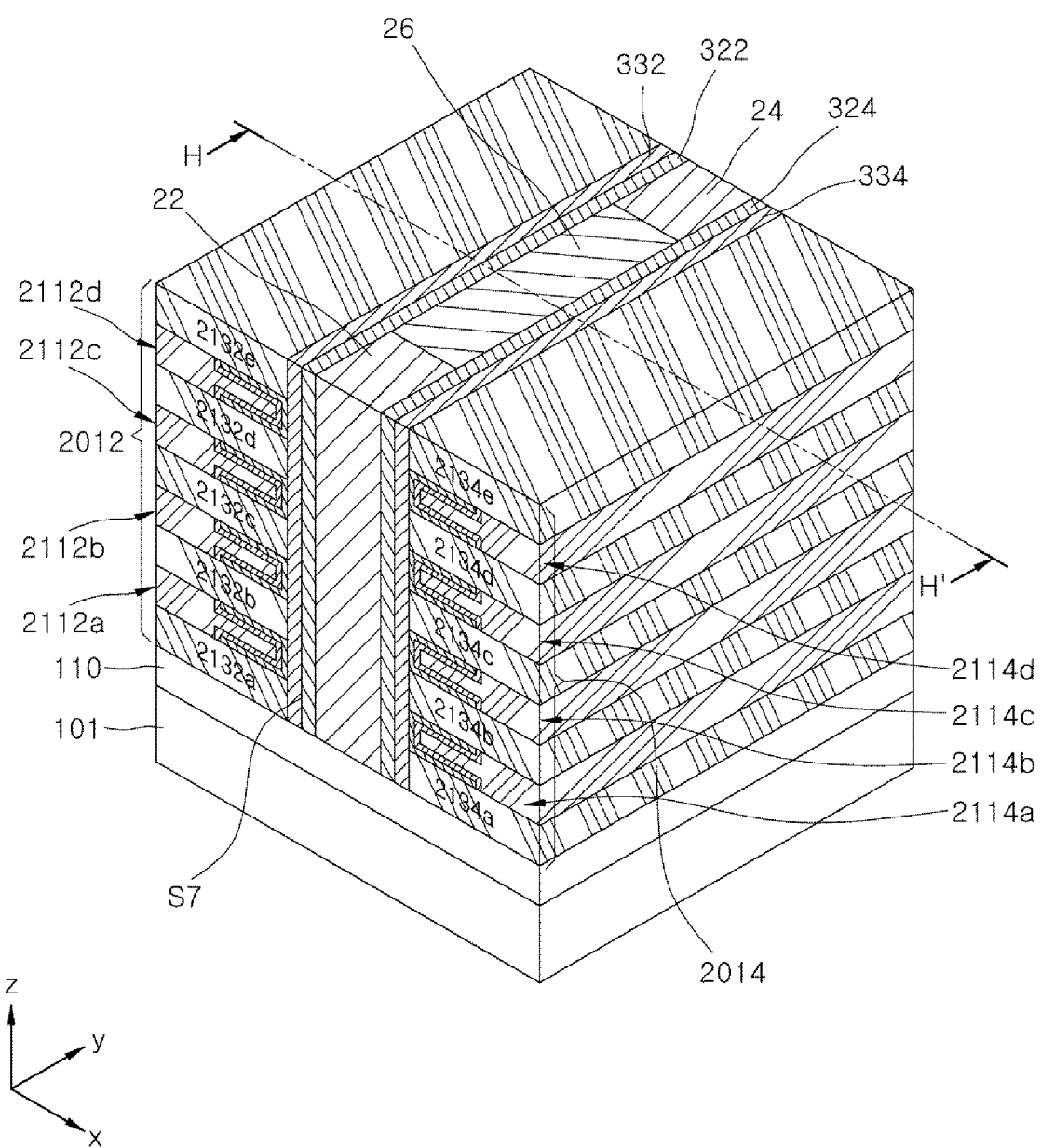
FIG. 19 is a perspective view schematically illustrating a nonvolatile memory device according to a further embodiment of the present disclosure.
Figure 20:
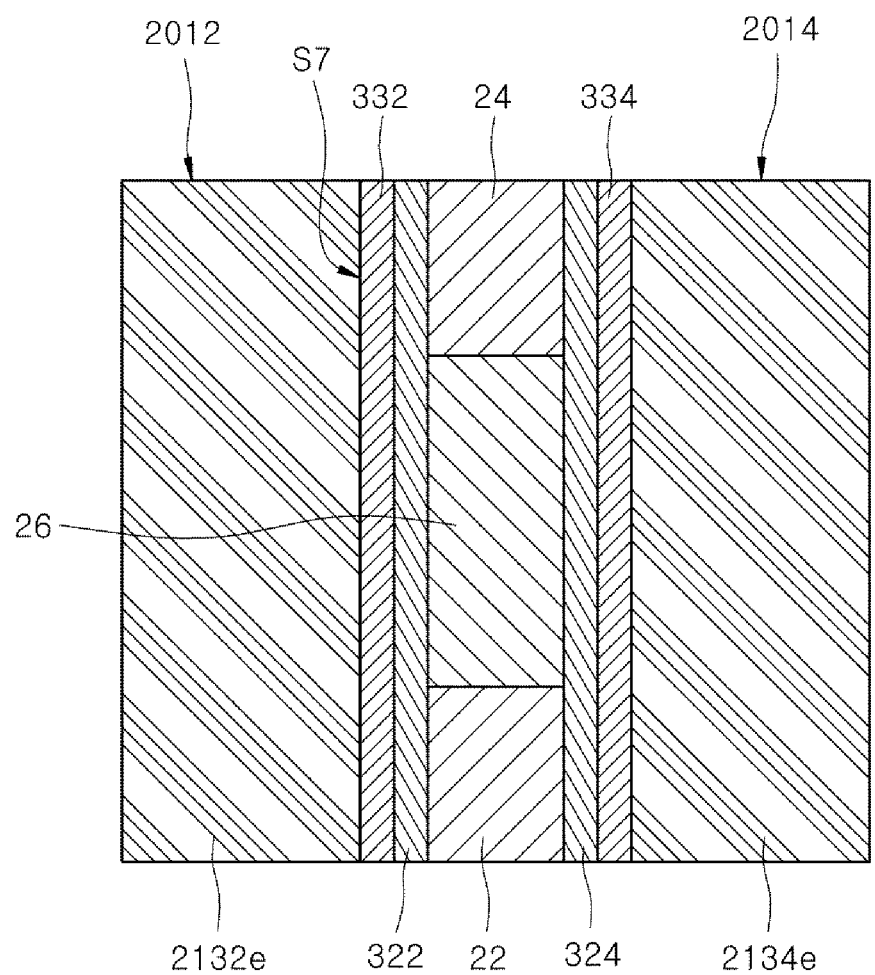
FIG. 20 is a plan view of the nonvolatile memory device of FIG. 19.
Figure 21:
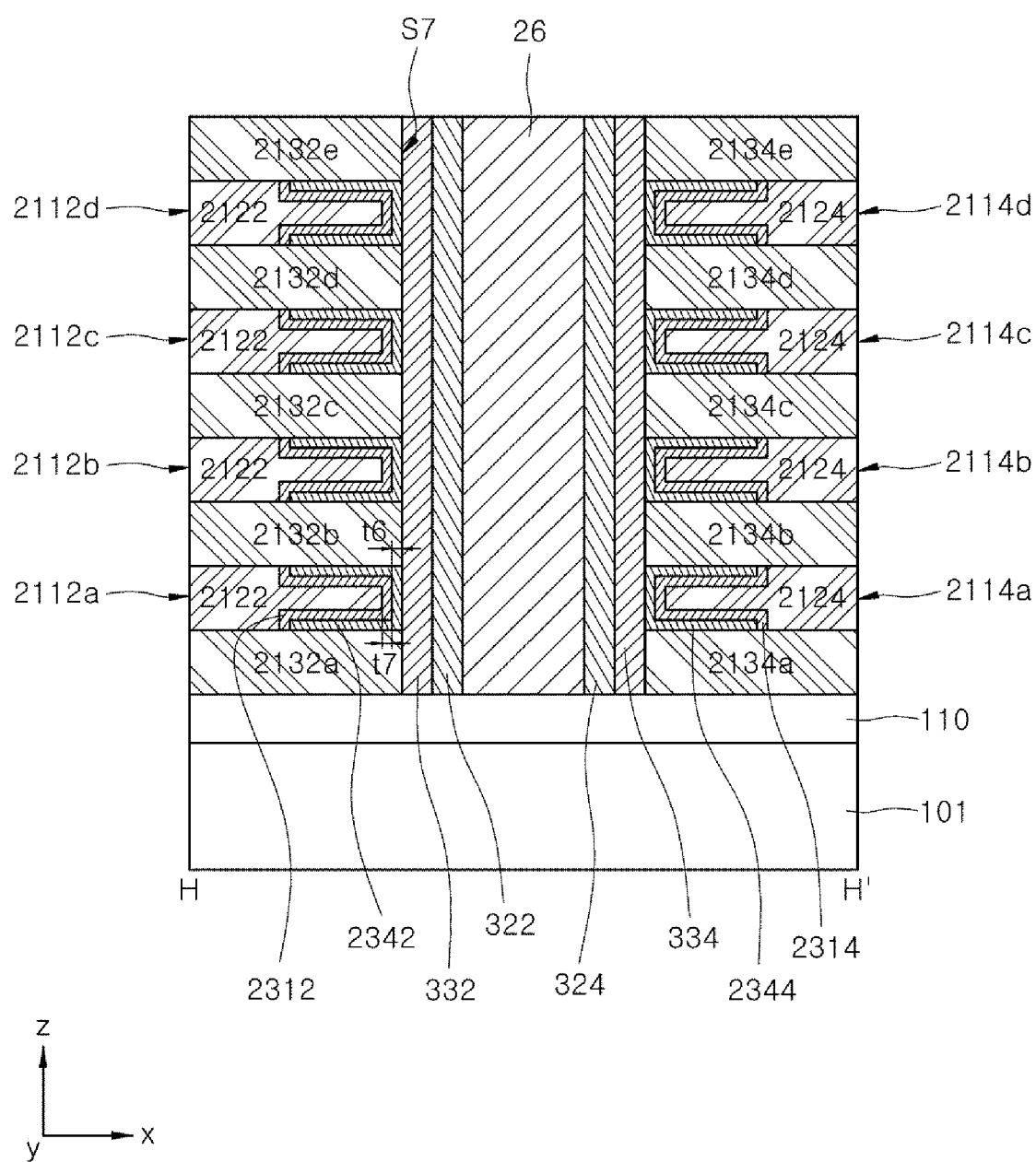
FIG. 21 is a cross-sectional view taken along a line H-H' of the nonvolatile memory device of FIG. 19.

FIG. 19 is a perspective view schematically illustrating a nonvolatile memory device 7 according to a further embodiment of the present disclosure. FIG. 20 is a plan view of the nonvolatile memory device of FIG. 19. FIG. 21 is a cross-sectional view taken along a line H-H' of the nonvolatile memory device of FIG. 19.

Referring to FIGS. 19 to 21, a nonvolatile memory device 7 may be differentiated, as compared to the nonvolatile memory device 4 of FIGS. 10 to 12, by configurations of first and second ferroelectric layer parts 2312 and 2314, first and second floating electrode layer parts 2342 and 2344, and first and second gate structures 2012 and 2014.

The first gate structure 2012 may include first to fourth gate functional layer patterns 2112a, 2112b, 2112c and 2112d and first to fifth gate insulation layer patterns 2132a, 2132b, 2132c, 2132d and 2132e, which are alternately stacked along a first direction (i.e., the z-direction) on the base insulation layer 110. The first gate structure 2012 may extend in a second direction (i.e., the y-direction).

A first interfacial insulation layer 332 may be disposed on one sidewall surface S7 of the first gate structure 2012. That is, the first interfacial insulation layer 332 may be disposed to cover the one sidewall surface S7 of the first gate structure 2012. The one sidewall surface S7 is a plane formed substantially parallel to the first and second directions (i.e., a y-z plane parallel to the z-direction and y-direction). In a specific embodiment, the first interfacial insulation layer 332 may be disposed to contact the first to fifth gate insulation layer patterns 2132a, 2132b, 2132c, 2132d and 2132e and the first floating electrode layer part 2342.

In addition, the first channel layer 322 may be disposed to contact the first interfacial insulation layer 332. The first channel layer 322 may be disposed on a plane formed substantially parallel to the first and second directions (i.e., a y-z plane parallel to the z-direction and y-direction).

Referring to FIG. 21, the first to fourth gate functional layer patterns 2112a, 2112b, 2112c and 2112d of the first gate structure 2012 may each have a first floating electrode layer part 2342, a first ferroelectric layer part 2312, and a first gate electrode layer part 2122. As an example, in the first gate functional layer pattern 2112a, the first floating electrode layer part 2342 may be disposed on the first interfacial insulation layer 332, and the first and second gate insulation layer patterns 2132a and 2132b. The first floating electrode layer part 2342 may have a predetermined thickness t6 in the x-direction from the first interfacial insulation layer 332, and in the z-direction from the first and second gate insulation layer patterns 2132a and 2132b. The first ferroelectric layer part 2312 may be disposed on the first floating electrode layer part 2342, and the first and second gate insulation layer patterns 2132a and 2132b. The first ferroelectric layer part 2312 may have a predetermined thickness t7 common to the first floating electrode layer part 2342. The first gate electrode layer part 2122 may be disposed to contact or cover the first ferroelectric layer part 2312 between the first and second gate insulation layer patterns 2132a and 2132b.

With respect to the second gate functional layer pattern 2112b, the first floating electrode layer part 2342, the first ferroelectric layer part 2312, and the first gate electrode layer part 2122 may be disposed between second and third gate insulation layer patterns 2132b and 2312c and contact the first interfacial insulation layer 332 in substantially the same manner. As another example, with the third gate functional layer pattern 2112c, the first floating electrode layer part 2342, the first ferroelectric layer part 2312, and the first gate electrode layer part 2122 may be disposed between the third and fourth gate insulation layer patterns 2132c and 2132d and contact the first interfacial insulation layer 332 in substantially the same manner. In the case of the fourth gate functional layer pattern 2112d, the first floating electrode layer part 2342, the first ferroelectric layer part 2312, and the first gate electrode layer part 2122 may be disposed between the fourth and fifth gate insulation layer patterns 2132d and 2132e and the contact first interfacial insulation layer 332 in substantially the same manner.

Referring to FIGS. 19 to 21, a source electrode structure 22, a drain electrode structure 24 and an insulation structure 26 may be disposed on the base insulation layer 110 to contact a first channel layer 322. In addition, a second channel layer 324 may be disposed, on the base insulation layer 110 to contact one sidewall surface of each of the source electrode structure 22, the drain electrode structure 24 and the insulation structure 26. In addition, a second interfacial insulation layer 334 may be disposed to contact the second channel layer 324.

On the base insulation layer 110, the second gate structure 2014 may be disposed to contact the second interfacial insulation layer 334. The second gate structure 2014 may include first to fourth gate functional layer patterns 2114a, 2114b, 2114c and 2114d and first to fifth gate insulation layer patterns 2134a, 2134b, 2134c, 2134d and 2134e, which are alternately stacked on the base insulation layer 110 along the first direction (i.e., the z-direction). The second gate structure 2014 may extend in the second direction (i.e., the y-direction).

The first to fourth gate functional layer patterns 2114a, 2114b, 2114c and 2114d of the second gate structure 2014 may each have a second floating electrode layer part 2344, a second ferroelectric layer part 2314 and a second gate electrode layer part 2124. The configurations of the second floating electrode layer part 2344, the second ferroelectric layer part 2314 and the second gate electrode layer part 2124 of the second gate structure 2014 may be substantially the same as the configurations of the first floating electrode layer part 2342, the first ferroelectric layer part 2312, and the first gate electrode layer part 2122 of the first gate structure 2012.

When comparing the nonvolatile memory device 7 according to the above-described embodiment with the nonvolatile memory device 4 of FIGS. 10 to 12, in the first to fourth gate functional layer patterns 2112a, 2112b, 2112c and 2112*d* of first gate structure 2012 and the first to fourth gate functional layer patterns 2114*a*, 2114*b*, 2114*c* and 2114*d* of second gate structure 2014, the areas of the first and second ferroelectric layer parts 2312 and 2314 that respectively contact the first and second gate electrode layer parts 2122 and 2124 can be increased. In addition, the areas of the first and second floating electrode layer parts 2342 and 2344 contacting the first and second ferroelectric layer parts 2312 and 2314 can be increased. As a result, by increasing the areas of the first and second ferroelectric layer parts 2312 and 2314 functioning as memory layers, the density of the remanent polarization stored in the ferroelectric layer parts 2313 and 2314 can be increased. As a result, the reliability of the memory operation can be improved.

Meanwhile, the material properties and functions of the first and second gate electrode layer parts 2122 and 2144, the first and second ferroelectric layer parts 2312 and 2314, the first and second floating electrode layer parts 2342 and 2344, the first to fifth gate insulations layer patterns 2132*a*, 2132*b*, 2132*c*, 2132*d*, 2132*e*, 2134*a*, 2134*b*, 2134*c*, 2134*d* and 2134*e* of the first and second gate structures 2012 and 2014 are substantially the same as the material properties and functions of the first to fourth gate electrode layer patterns 122*a*, 122*b*, 122*c*, 122*d*, 124*a*, 124*b*, 124*c* and 124*d* of the first and second gate structures 12 and 14, the first and second ferroelectric layers 312 and 314, the first and second floating electrode layers 342 and 344, and the first to fifth gate insulation layer patterns 132*a*, 132*b*, 132*c*, 132*d*, 132*e*, 134*a*, 134*b*, 134*c*, 134*d* and 134*e* of the first and second gate structures 12 and 14, respectively, of embodiments described above with reference to FIGS. 10 to 12.

Figure 22:
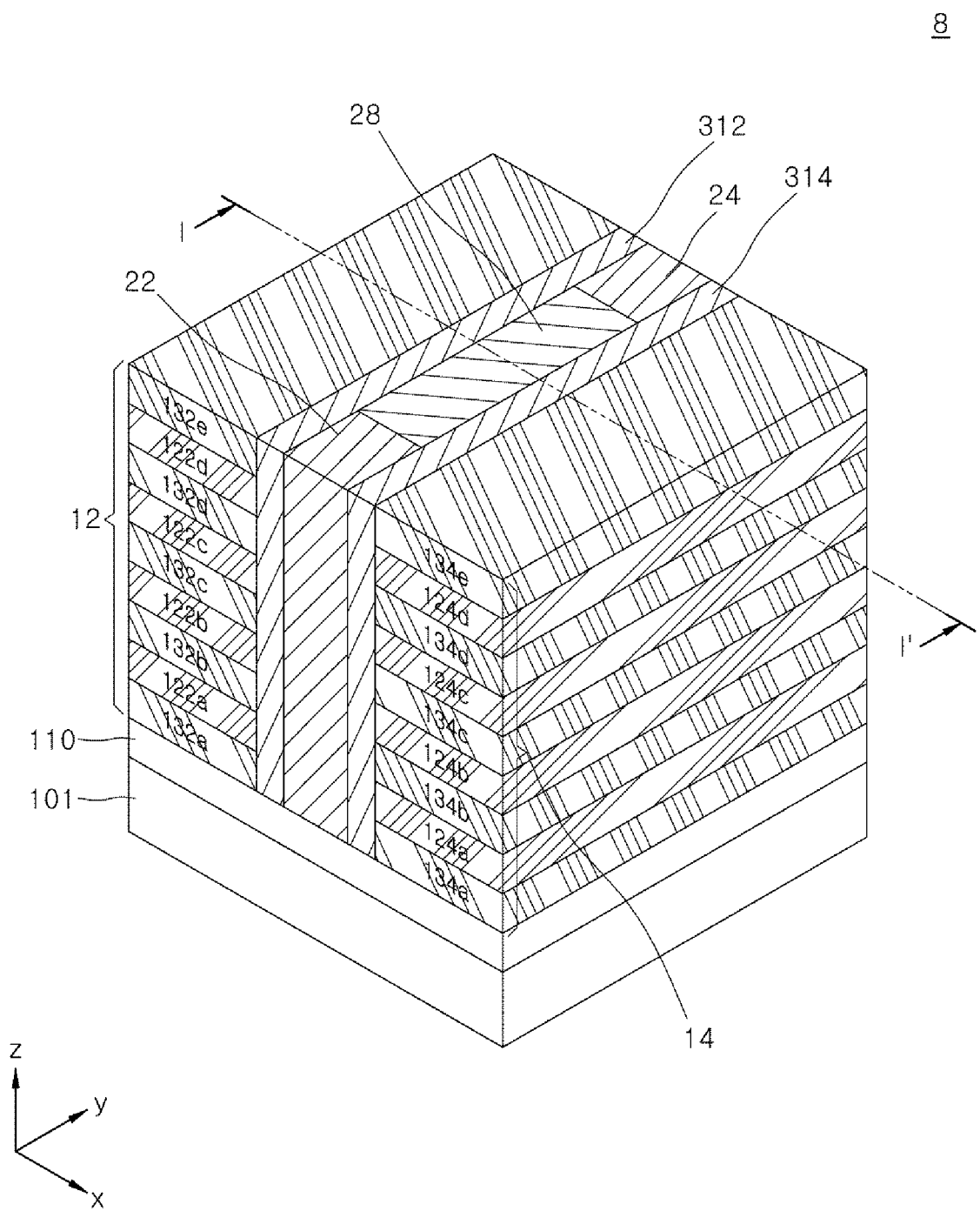
FIG. 22 is a perspective view schematically illustrating a nonvolatile memory device according to a still further embodiment of the present disclosure.
Figure 23:
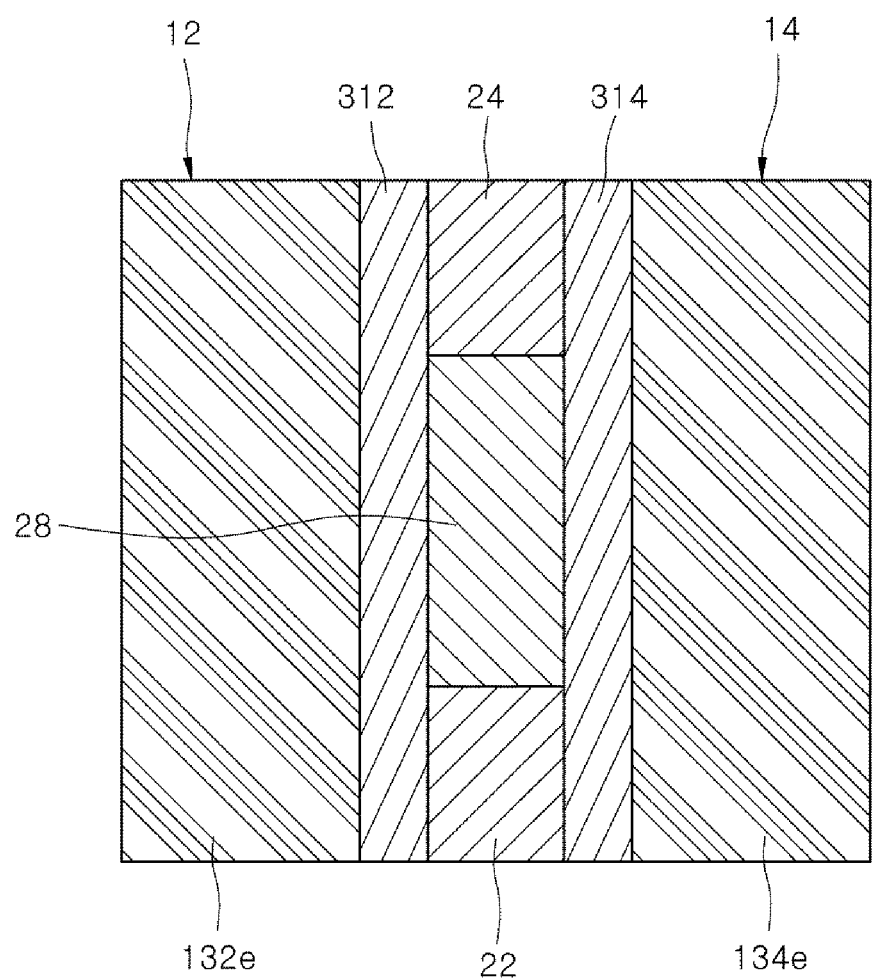
FIG. 23 is a plan view of the nonvolatile memory device of FIG. 22.
Figure 24:
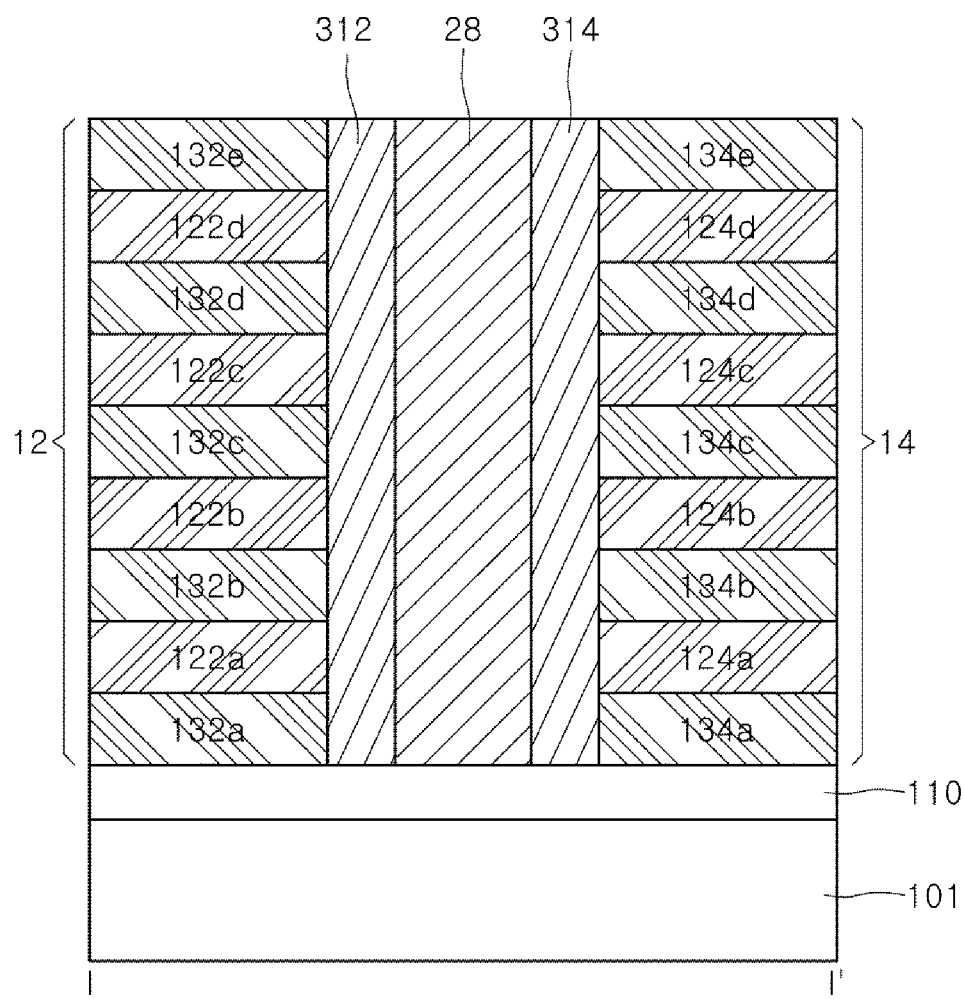
FIG. 24 is a cross-sectional view taken along a line I-I' of the nonvolatile memory device of FIG. 22.

FIG. 22 is a perspective view schematically illustrating a nonvolatile memory device 8 according to a still further embodiment of the present disclosure. FIG. 23 is a plan view of the nonvolatile memory device of FIG. 22. FIG. 24 is a cross-sectional view taken along a line I-I' of the nonvolatile memory device of FIG. 22.

Referring to FIGS. 22 to 24, a nonvolatile memory device 8 is differentiated, as compared to a nonvolatile memory device 1 of FIGS. 1 to 3, in a configuration of a channel structure 28.

In this embodiment, a channel structure 28 replaces an insulation structure 26 in the nonvolatile memory device 1 of FIGS. 1 to 3. That is, the channel structure 28 may be disposed to contact a source electrode structure 22 and a drain electrode structure 24 in a second direction (i.e., the y-direction). Further, the channel structure 28 may be disposed to contact first and second ferroelectric layers 312 and 314 in a third direction (i.e., the x-direction). Accordingly, the first and second channel layers 322 and 324 of the nonvolatile memory device 1 of FIGS. 1 to 3 are omitted from the nonvolatile memory device 8 of this embodiment.

The channel structure 28 may have a pillar-like shape extending in a first direction (i.e., the z-direction) from a base insulation layer 110. When a read voltage is applied to at least one of first to fourth gate electrode layer patterns 122*a*, 122*b*, 122*c* and 122*d* of a first gate structure 12, a conductive channel may be formed in a region of the channel structure 28, overlapping the at least one gate electrode layer pattern. Likewise, when the read voltage is applied to at least one of first to fourth gate electrode layer patterns 124*a*, 124*b*, 124*c* and 124*d* of a second gate structure 14, a conductive channel may be formed in a region of the channel structure 28, overlapping the at least one gate electrode layer pattern.

The channel structure 28 may, for example, include a doped semiconductor material or metal oxide. The semiconductor material may, for example, include silicon (Si), germanium (Ge), gallium arsenide (GaAs), and the like. The metal oxide may include indium-gallium-zinc (In-Ga—Zn) oxide. In an embodiment, the channel structure 28 may include silicon (Si) doped with an n-type dopant. Alternatively, the channel structure 28 may include c-axis aligned indium-gallium-zinc (In-Ga—Zn) oxide. The channel structure 28 may have a single crystal structure or a polycrystalline structure.

As described above, the nonvolatile memory device 8 of the present embodiment may include a pillar-shaped channel structure 28. The device structure and manufacturing process can be simplified by using the channel structure 28, at the same location, instead of the insulating structure 26 of the nonvolatile memory device 1 of FIGS. 1 to 3.

In other embodiments, in a nonvolatile memory device 2 of FIG. 5, a nonvolatile memory device in which the insulation structures 26*a* and 26*b* are replaced with channel structures 28 of the present embodiment may be implemented, while omitting the first and second channel layers 322 and 324. Likewise, in a nonvolatile memory device 3 of FIGS. 7 to 9, a nonvolatile memory device 4 of FIGS. 10 to 12, a nonvolatile memory device 5 of FIGS. 13 to 15, and a nonvolatile memory device 7 of FIGS. 19 to 21, nonvolatile memory devices in which the insulating structures 26 are replaced with channel structures 28 of the present embodiment can be implemented. In such embodiments, the first and second channel layers 322 and 324 may be omitted. In addition, in a nonvolatile memory device 6 of FIGS. 16 to 18, a nonvolatile memory device in which an insulating structure 26 is replaced with a channel structure 28 of the present embodiment may be implemented, while omitting the first and second channel layers 1322 and 1324 of the nonvolatile memory device 6 of FIGS. 16 to 18.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:
1. A nonvolatile memory device comprising:
a substrate having an upper surface;
a gate structure disposed over the substrate, the gate structure comprising at least one gate electrode layer pattern and at least one gate insulation layer pattern, which are alternately stacked along a first direction perpendicular to the upper surface, wherein the gate structure extends in a second direction perpendicular to the first direction;
a ferroelectric layer disposed over the substrate and disposed on at least a portion of one sidewall surface of the gate structure, wherein the one sidewall surface of the gate structure forms a plane substantially parallel to the first and second directions;
a channel layer disposed over the substrate and disposed on the ferroelectric layer;
a source electrode structure and a drain electrode structure, spaced apart from each other in the second direction, each disposed over the substrate and disposed to contact the channel layer; and
a conductive channel formed in the channel layer,
wherein the conductive channel extends in the second direction to electrically connect the source electrode structure and the drain electrode structure over the substrate.

2. The nonvolatile memory device of claim 1, further comprising a base insulation layer disposed on the substrate to contact the gate structure, the ferroelectric layer, the channel layer, the source electrode structure, and the drain electrode structure.

3. The nonvolatile memory device of claim 1, wherein the ferroelectric layer has a predetermined thickness in a third direction perpendicular to the first and second directions.

4. The nonvolatile memory device of claim 1, wherein the channel layer comprises a doped semiconductor material or metal oxide.

5. The nonvolatile memory device of claim 1, wherein each of the source electrode structure and the drain electrode structure has a pillar shape extending in the first direction.

6. The nonvolatile memory device of claim 1, further comprising an insulation structure disposed between the source electrode structure and the drain electrode structure.

7. The nonvolatile memory device of claim 1, wherein the gate insulation layer pattern separates the ferroelectric layer and the channel layer with the second direction and a third direction that is perpendicular to the first and second direction.

8. The nonvolatile memory device of claim 7, wherein the gate electrode layer pattern is disposed to contact the ferroelectric layer in the third direction, and
wherein the gate insulation layer pattern is disposed to contact the source electrode structure and the drain electrode structure in the third direction.

9. A nonvolatile memory device comprising:
a substrate having an upper surface;
a gate structure disposed over the substrate, the gate structure comprising at least one gate electrode layer pattern and at least one gate insulation layer pattern, which are alternately stacked along a first direction perpendicular to the upper surface, wherein the gate structure extends in a second direction perpendicular to the first direction;
a ferroelectric layer disposed on at least a portion of one sidewall surface of the gate structure, wherein the one sidewall surface of the gate structure forms a plane substantially parallel to the first and second directions;
a source electrode structure and a drain electrode structure spaced apart from each other in the second direction, each disposed over the substrate and each disposed on the ferroelectric layer;
a channel structure disposed over the substrate and disposed between the source electrode structure and the drain electrode structure, and
a conductive channel formed in some portions of the channel structure,
wherein the conductive channel extends in the second direction to electrically connect the source electrode structure and the drain electrode structure over the substrate.

10. The nonvolatile memory device of claim 9, further comprising a base insulation layer disposed on the substrate to contact the gate structure, the ferroelectric layer, the source electrode structure, the drain electrode structure, and the channel structure in the first direction.

11. The nonvolatile memory device of claim 9, wherein the channel structure has a pillar shape extending along the first direction.

12. The nonvolatile memory device of claim 9, wherein the channel structure contacts the source electrode structure and the drain electrode structure in the second direction, and contacts the ferroelectric layer in a third direction perpendicular to the first and second directions.

* * * * *